(12) United States Patent
Ueda

(10) Patent No.: US 10,460,783 B2
(45) Date of Patent: Oct. 29, 2019

(54) MAGNETIC STORAGE DEVICE

(71) Applicant: TOSHIBA MEMORY CORPORATION, Tokyo (JP)

(72) Inventor: Yoshihiro Ueda, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/114,162

(22) Filed: Aug. 27, 2018

(65) Prior Publication Data

US 2019/0287593 A1 Sep. 19, 2019

(30) Foreign Application Priority Data

Mar. 19, 2018 (JP) ................. 2018-051178

(51) Int. Cl.
| | | |
|---|---|---|
| *G11C 11/16* | (2006.01) | |
| *H01L 43/08* | (2006.01) | |
| *G11C 13/00* | (2006.01) | |

(52) U.S. Cl.
CPC ........ *G11C 11/1673* (2013.01); *G11C 11/161* (2013.01); *G11C 11/1655* (2013.01); *G11C 11/1657* (2013.01); *G11C 11/1675* (2013.01); *H01L 43/08* (2013.01); *G11C 13/0002* (2013.01)

(58) Field of Classification Search
None
See application file for complete search history.

(56) References Cited

U.S. PATENT DOCUMENTS

| | | | |
|---|---|---|---|
| 7,102,945 B2 | 9/2006 | Tsuchida et al. | |
| 8,320,152 B2 | 11/2012 | Cho et al. | |
| 8,331,125 B2 | 12/2012 | DeBrosse | |
| 8,450,818 B2 * | 5/2013 | Nikonov | B82Y 25/00 257/421 |
| 2004/0252539 A1 * | 12/2004 | Parkin | G11C 11/14 365/80 |
| 2015/0029786 A1 | 1/2015 | Andre et al. | |
| 2016/0224242 A1 | 8/2016 | Kondo et al. | |

* cited by examiner

*Primary Examiner* — Tan T. Nguyen
(74) *Attorney, Agent, or Firm* — Kim & Stewart LLP

(57) ABSTRACT

A magnetic storage device includes a magnetic storage thin line including a linear magnetic body having first and second magnetic domains whose magnetization directions are variable, a magnetoresistance effect element having a first resistance according to the magnetization direction of the first magnetic domain or a second resistance according to the magnetization direction of the second magnetic domain, and a read circuit that compares the first resistance of the magnetoresistance effect element with the second resistance of the magnetoresistance effect element. The read circuit outputs first data when the first resistance and the second resistance correspond to the same low or high resistance state and outputs second data when the first resistance and the second resistance correspond to different low/high resistance states.

20 Claims, 20 Drawing Sheets

MAGNETIC STORAGE DEVICE

CROSS-REFERENCE TO RELATED APPLICATIONS

This application is based upon and claims the benefit of priority from Japanese Patent Application No. 2018-051178, filed Mar. 19, 2018, the entire contents of which are incorporated herein by reference.

FIELD

Embodiments described herein relate generally to a magnetic storage device.

BACKGROUND

A magnetic storage device which uses a magnetic thin wire having a plurality of magnetic domains is known as a magnetic storage device.

DETAILED DESCRIPTION

Figure 1:
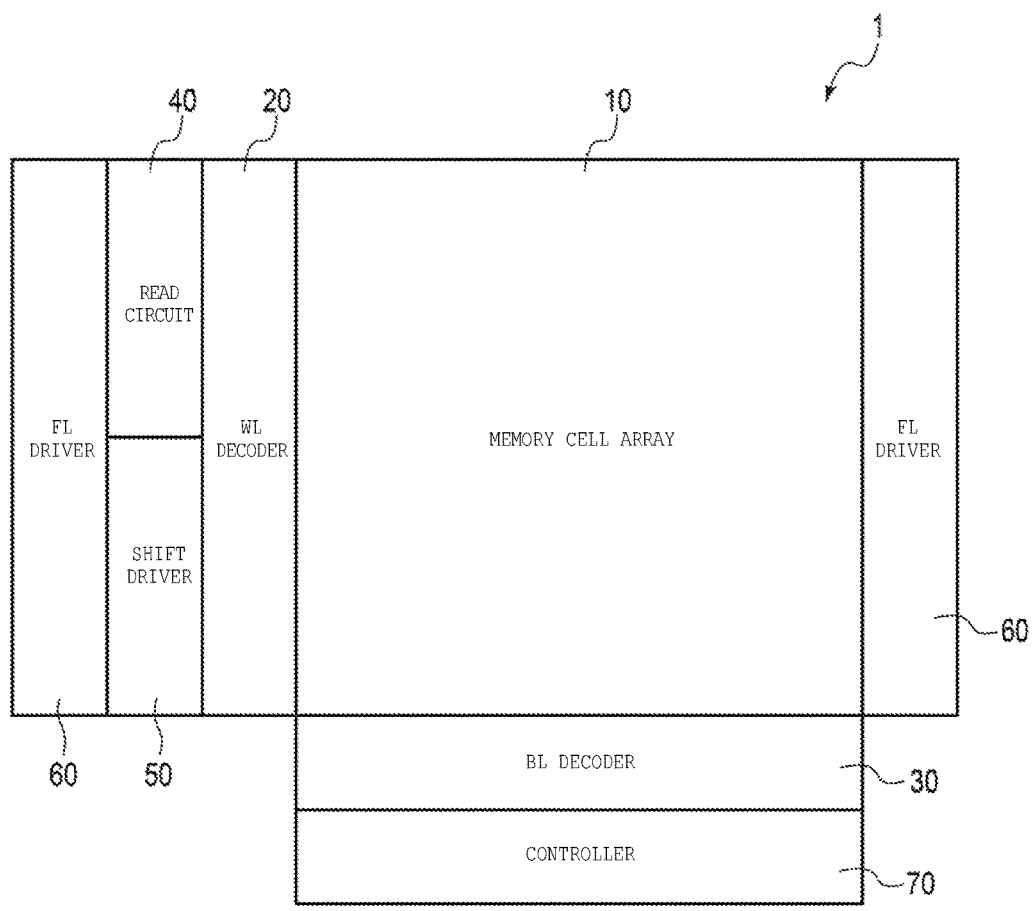
FIG. 1 is a block diagram illustrating a configuration of a magnetic storage device according to a first embodiment.

Embodiments provide a magnetic storage device capable of performing a stable read operation.

In general, according to one embodiment, a magnetic storage device includes a magnetic wire including a linear magnetic body having first and second magnetic domains whose magnetization directions are variable, a magnetoresistance element having a first resistance according to the magnetization direction of the first magnetic domain or a second resistance according to the magnetization direction of the second magnetic domain, and a read circuit that compares the first resistance of the magnetoresistance element with the second resistance of the magnetoresistance element. The read circuit outputs first data when the first resistance and the second resistance correspond to the same low or high resistance state and outputs second data when the first resistance and the second resistance correspond to different low/high resistance states.

Hereinafter, embodiments will be described with reference to the drawings. In the following description, configuration elements having the same function and configuration are denoted by the same reference numerals or symbols. In addition, the respective embodiments described below exemplify a device and a method for embodying the technical ideas of the embodiments, and materials, shapes, structures, arrangements, and the like of the configuration components are not limited to those described below.

Each functional block can be realized by hardware or computer software or a combination of both. A part of the functions may be performed by a functional block different from the exemplified functional block. Furthermore, the exemplified functional block may be divided into more detailed functional sub-blocks.

1. First Embodiment

A magnetic storage device according to a first embodiment will be described. The magnetic storage device is also referred to as a magnetic wall movement memory.

1-1. Configuration of Magnetic Storage Device

A configuration of the magnetic storage device according to the first embodiment will be described with reference to FIG. 1. FIG. 1 is a block diagram illustrating the configuration of the magnetic storage device according to the first embodiment. A magnetic storage device 1 includes a memory cell array 10, a word line (WL) decoder 20, a bit line (BL) decoder 30, a read circuit 40, a shift driver 50, a field line (FL) driver 60, and a controller 70.

The memory cell array 10 includes a plurality of magnetic storage thin lines (or magnetic thin lines). The magnetic storage thin line includes a plurality of magnetic domains (or magnetic walls) for storing data. The magnetic storage thin lines are arranged in a matrix. The magnetic storage thin line is electrically connected between a word line WL and a bit line BL. Details of the magnetic storage thin line will be described below.

The word line decoder 20 selects one word line from a plurality of word lines WL, based on a row address. The bit line decoder 30 selects one bit line from a plurality of bit lines BL, based on a column address. The read circuit 40 includes a sense amplifier and reads data from the magnetic storage thin line in the memory cell array 10. In the read operation, the shift driver 50 applies a voltage for moving magnetic domains (or magnetic walls) in the magnetic storage thin line. That is, a shift current that shifts each magnetic domain arranged in the magnetic storage thin line is output. The field line driver 60 supplies a current to a field line at the time of writing and generates an induced magnetic field corresponding to the write data from the field line.

1-1-1. Configuration of Memory Cell Array 10

Figure 2:
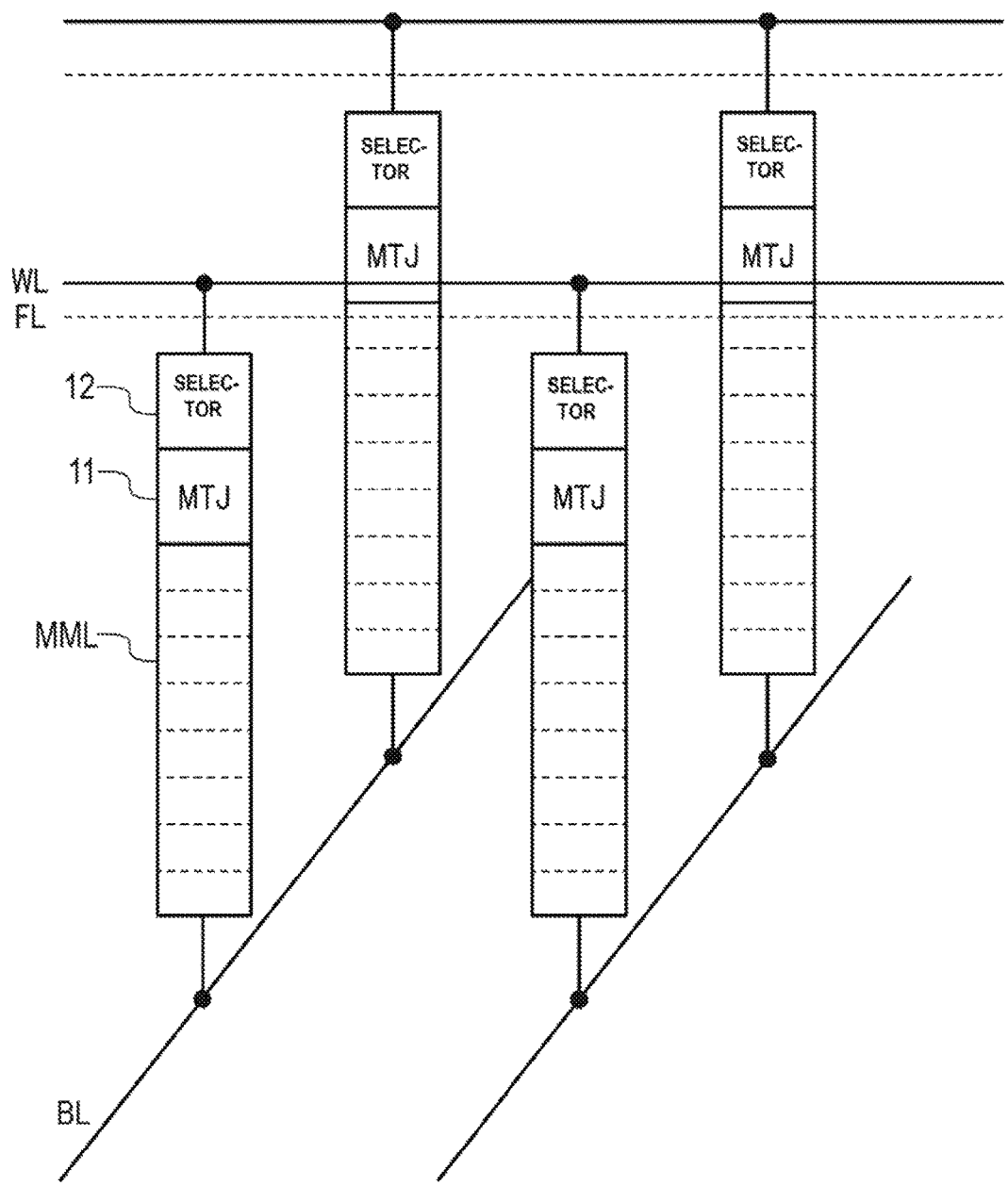
FIG. 2 is a diagram illustrating a circuit configuration of a memory cell array according to the first embodiment.

Next, a circuit configuration of the memory cell array 10 according to the first embodiment will be described with reference to FIG. 2. FIG. 2 is a diagram illustrating the circuit configuration of the memory cell array 10.

A magnetic storage thin line MML is electrically connected between the word line WL and the bit line BL. One end of the magnetic storage thin line MML is connected to the word line WL via a magnetoresistance effect element (or resistance change element, variable resistance element) 11 and a selection element 12 (depicted in FIG. 2 as SELECTOR) in consecutive order. That is, one end of the magnetic storage thin line MML is connected to one end of the magnetoresistance effect element 11, and the other end of the magnetoresistance effect element 11 is connected to one end of the selection element 12. The other end of the selection element 12 is connected to the word line WL. Furthermore, the other end of the magnetic storage thin line MML is connected to the bit line BL.

The magnetoresistance effect element 11 includes, for example, a magnetic tunnel junction (MTJ) element of which resistance changes according to a magnetization state. The selection element 12 includes, for example, an element which enters a low resistance state if a voltage equal to or higher than a threshold voltage is applied and enters a high resistance state if a voltage lower than the threshold voltage is applied. The selection element 12 may be, for example, a switch element between two terminals. In a case where a voltage applied between the two terminals is equal to or lower than a threshold value, the switch element enters a "high resistance" state, for example, an electrical disconnection state. In a case where the voltage applied between the two terminals is equal to or higher than the threshold value, the switch element changes to a "low resistance" state, for example, an electrical connection state. The switch element can be configured to perform this function regardless of a polarity of the voltage. The switch element contains at least one chalcogen element selected from a group configured with Te, Se, and S. Alternatively, the switch element may contain chalcogenide which is a compound containing the chalcogen element. In addition to this, the switch element may contain at least one element selected from a group configured with B, Al, Ga, In, C, Si, Ge, Sn, As, P, and Sb.

For example, the plurality of magnetic storage thin lines MML, the plurality of magnetoresistance effect elements 11, and the plurality of selection elements 12, which are arranged in a first direction, are connected to the same word line WL via the other ends of the selection elements 12. Meanwhile, the plurality of magnetic storage thin lines MML, the plurality of magnetoresistance effect elements 11, and the plurality of selection elements 12, which are arranged in a second direction crossing the first direction, are connected to the same bit line BL via the other ends of the magnetic storage thin lines MML.

Figure 3:
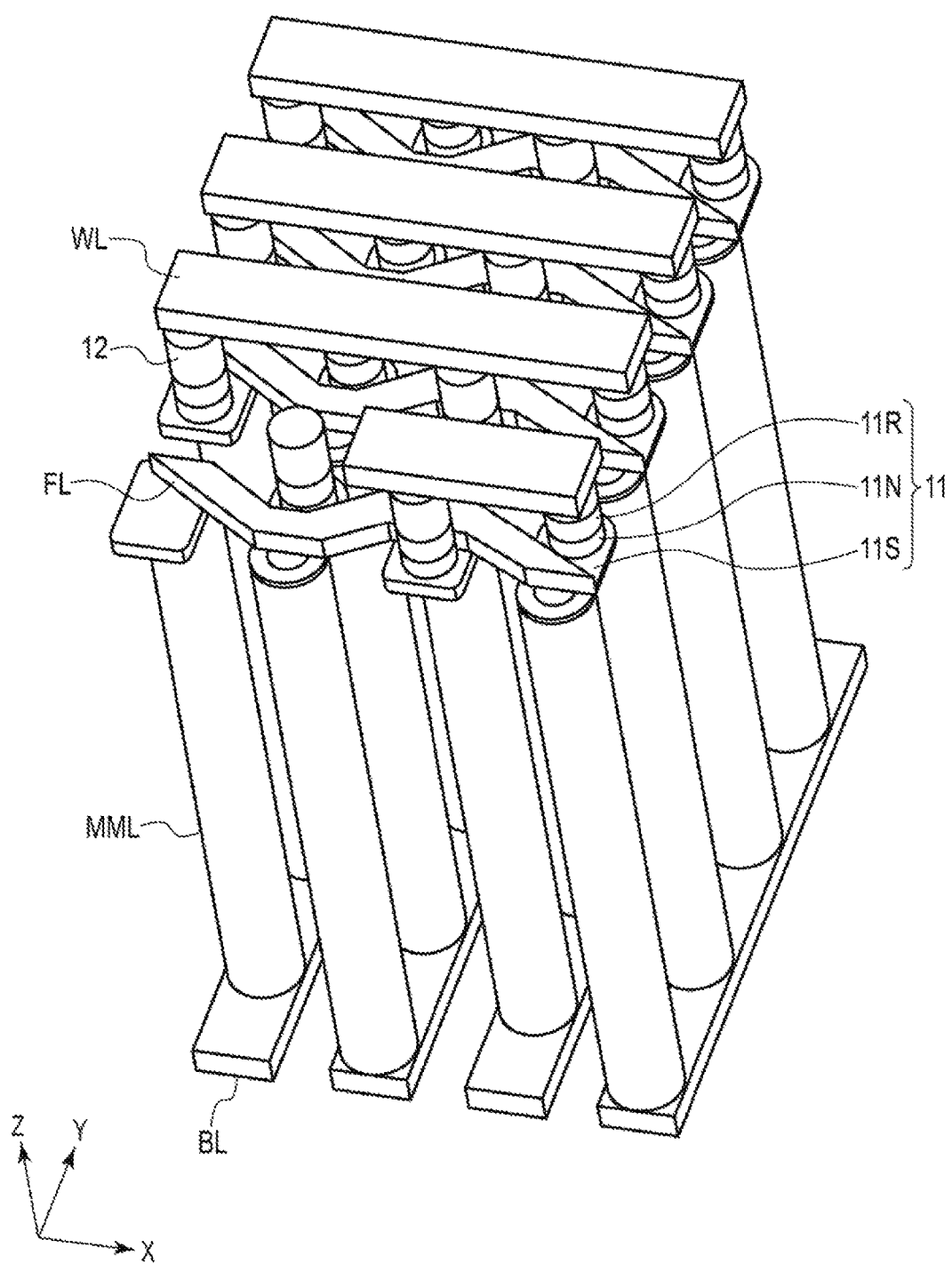
FIG. 3 is a perspective view illustrating an example of a configuration of the memory cell array according to the first embodiment.

FIG. 3 is a perspective view illustrating an example of a configuration of the memory cell array 10. In FIG. 3, two directions orthogonal to each other are defined as an X direction and a Y direction, and a direction which is orthogonal to the X direction and the Y direction (an XY plane) and in which the magnetic storage thin line MML extends is defined as a Z direction.

A plurality of bit lines BL extending in the Y direction are arranged in the X direction. The magnetic storage thin line MML, the magnetoresistance effect element 11, and the selection element 12 are arranged on the bit line BL in the Z direction. The magnetoresistance effect element 11 is configured with, for example, an MTJ element. The MTJ element includes a magnetic layer 11R, a nonmagnetic layer 11N, and a magnetic layer 11S. Details of the MTJ element will be described below.

The configuration of the memory cell array 10 will be described in detail. The magnetic storage thin line MML is provided on the bit line BL. The magnetic layer 11S is provided on the magnetic storage thin line MML. The magnetic layer 11S extends a certain distance in the Y direction, and the nonmagnetic layer 11N and the magnetic layer 11R are sequentially provided on the extended magnetic layer 11S. The word line WL is provided on the magnetic layer 11R via the selection element 12.

The magnetic storage thin line MML, the magnetoresistance effect element 11, and the selection element 12, which are provided in the Z direction, are arranged in a matrix along the X and Y directions. The word line WL is provided on the selection element 12 arranged in the X direction. Furthermore, a field line FL is provided on the magnetic layer 11S. The field lines FL is disposed in a zigzag manner in the X direction so as to weave between the magnetoresistance effect elements 11 adjacent to each other in the X direction and the Y direction.

Hereinafter, the MTJ element will be described in detail. The MTJ element includes the magnetic layer 11R, the nonmagnetic layer 11N, and the magnetic layer 11S. The nonmagnetic layer 11N is disposed between the magnetic layer 11R and the magnetic layer 11S. The magnetic layer 11R functions as a reference layer, and the magnetic layer 11S functions as a storage layer. The nonmagnetic layer 11N functions as a tunnel barrier. The MTJ element may further include other layers.

The magnetic layer (storage layer) 11S is magnetized in a direction along a certain axis. For example, magnetization of the magnetic layer 11S is stable along a direction parallel to a boundary surface between the layers 11S, 11R, and 11N. A magnetization direction of the magnetic layer 11S may be inverted by the magnetization direction of the magnetic domains included in the magnetic storage thin line MML.

The magnetic layer (reference layer) 11R has the magnetization of which direction is fixed or invariable, and has, for example, a coercive force larger than a coercive force of the magnetic layer (storage layer) 11S. The fact that a magnetization direction of the magnetic layer 11R is "fixed" or "invariable" means that the magnetization direction of the magnetic layer (reference layer) 11R is not reversed, depending on the magnetization direction of the magnetic domains of the magnetic storage thin line MML, which reverses magnetization of the magnetic layer (storage layer) 11S.

A set of the magnetic layer 11R, the nonmagnetic layer 11N, and the magnetic layer 11S exhibits a magnetoresistance effect. Specifically, if the magnetization direction of the magnetic layer 11S and the magnetization direction of the magnetic layer 11R are parallel and antiparallel, the MTJ element illustrates the minimum and maximum resistance values, respectively. The magnetoresistance effect element (MTJ element) 11 is in a low resistance state when a relative relationship between the magnetization directions of the magnetic layer (storage layer) 11S and the magnetic layer (reference layer) 11R is parallel, and is in a high resistance state when the relative relationship is antiparallel.

Figure 4:
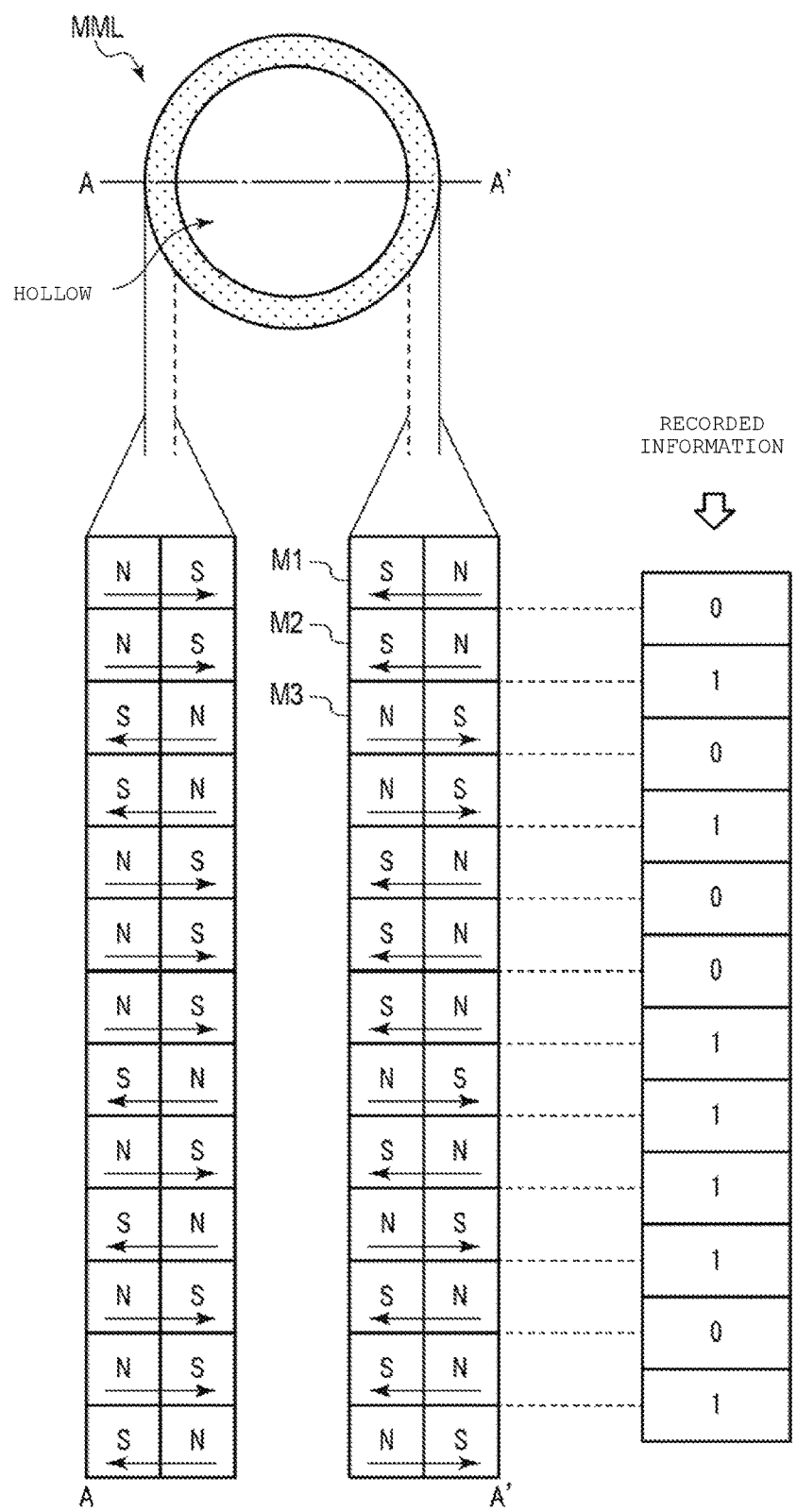
FIG. 4 is a diagram illustrating magnetic domains of a magnetic storage thin line and an information storage method, according to the first embodiment.

1-1-2. Configuration of Magnetic Storage Thin Line and Information Storage Method Next, a configuration of the magnetic storage thin line MML and an information storage method according to the first embodiment will be described with reference to FIG. 4. FIG. 4 is a diagram illustrating a cross-sectional structure taken along a line A-A' of one magnetic storage thin line MML illustrated in FIG. 3, an example of the magnetic domains (or magnetization state) of the magnetic storage thin line MML, and the information storage method which uses the magnetic domains.

The magnetic storage thin line MML in the magnetic storage device is configured with, for example, a linear ferromagnetic body extending in the Z direction illustrated in FIG. 3. For example, as illustrated in FIG. 4, the linear ferromagnetic body may have a hollow tubular shape (for example, a cylindrical shape), or a shape without a hollow portion in the central portion. The ferromagnetic body includes a plurality of magnetic domains along the Z direction. For example, the magnetic storage thin line MML includes magnetic domains M1, M2, M3, . . . in the Z direction in a cross-section of a cylindrical magnetic thin film.

Each magnetic domain may hold magnetization (or magnetization state) in one direction or in a direction opposite to the one direction. As illustrated in FIG. 4, each magnetic domain has a magnetization direction formed in the order of an N pole and an S pole from the outside of a cylinder, and the magnetization direction formed in the order of the S pole and the N pole from the outside of the cylinder. A boundary between the magnetic domain and the magnetic domain is called a magnetic wall. The magnetization direction of each magnetic domain may be perpendicular to the Z direction in which the magnetic storage thin line MML extends (in-plane magnetization film), or may be the Z direction in which the magnetic storage thin line MML extends (vertical magnetization film).

In a case where the magnetization directions of two adjacent magnetic domains in the Z direction are the same, it is assumed that first data is stored. Meanwhile, in a case where the magnetization directions of the two adjacent magnetic domains are different from each other, it is assumed that second data different from the first data is stored. For example, since the magnetization directions of a magnetic domain M1 and a magnetic domain M2 are the same, "0" is stored. Meanwhile, since the magnetization directions of the magnetic domain M2 and a magnetic domain M3 are different from each other, "1" is stored. In a case where the magnetization directions are the same as the magnetization direction between the magnetic domain M1 and the magnetic domain M2, the magnetic wall does not exist between the magnetic domain M1 and the magnetic domain M2.

1-2. Write and Read Operation

Next, write and read operations of the magnetic storage device according to the first embodiment will be described. In reading and writing data, the magnetic domain to be read or written is shifted to a position (hereinafter, referred to as a read position or a write position) of a mechanism for the reading or writing. That is, the magnetic wall between the magnetic domains is shifted such that the magnetic domain to be read or written moves to the read position or the write position. The shift of the magnetic wall is performed, for example, by making a current pass through the magnetic storage thin line MML.

Figure 5:
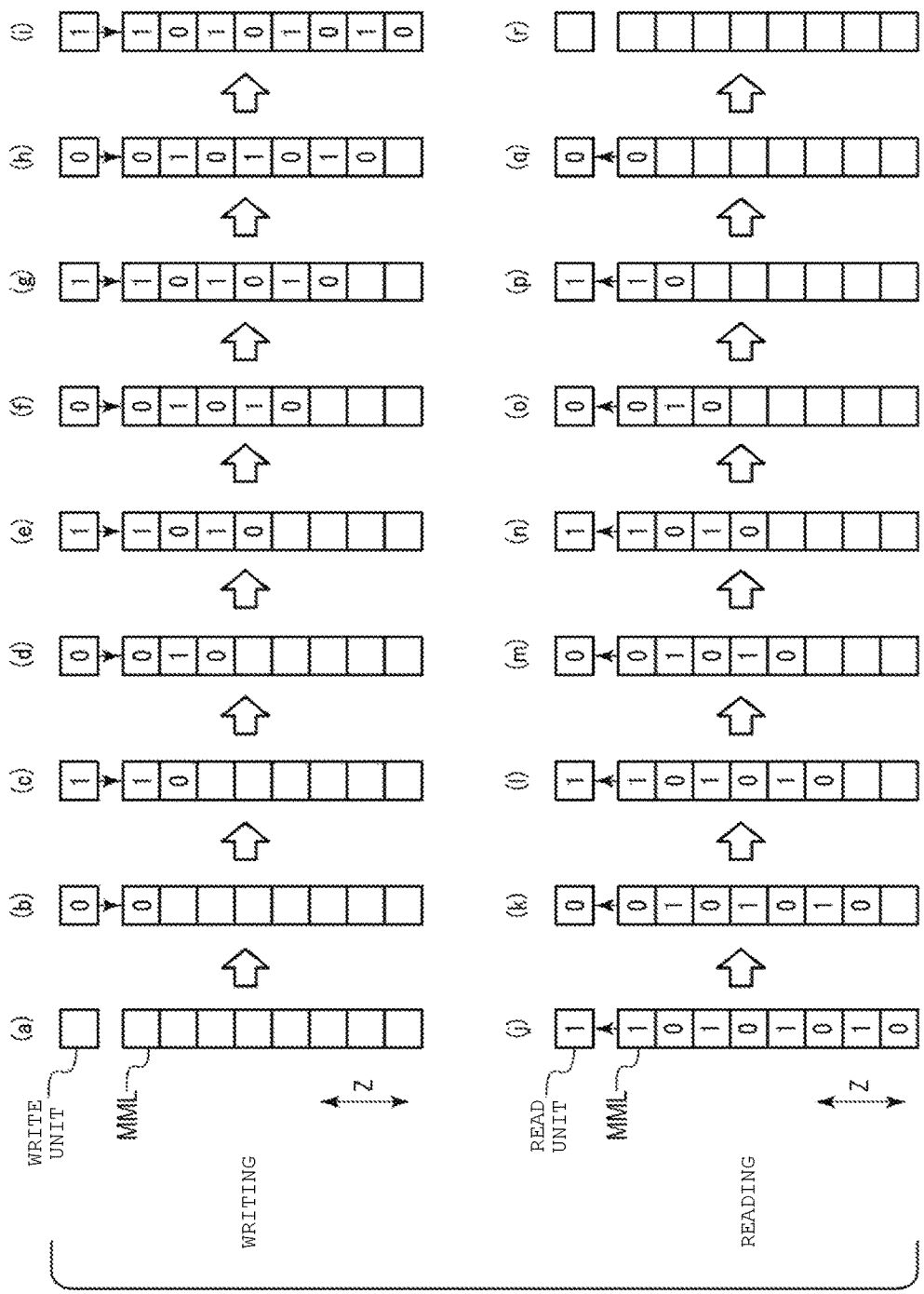
FIG. 5 illustrates parts (a) to (r) of a sequence of writing and reading to and from the magnetic storage thin line according to the first embodiment.

FIG. 5, parts (a) to (r) are diagrams illustrating a sequence of writing and reading to and from the magnetic storage thin line MML. Here, a conceptual sequence of the writing and reading is illustrated.

First, a writing sequence will be described. In writing, if "0" is written by a write unit as illustrated in FIG. 5, part (b) from a state before writing as illustrated in FIG. 5, part (a), "0" is written to the first magnetic section of the magnetic storage thin line MML. Next, as illustrated in FIG. 5, part (c), if "1" is written by the write unit, "0" in the first magnetic section of the magnetic storage thin line MML is shifted to the second magnetic section, and "1" is written to the first magnetic section. Furthermore, as illustrated in FIG. 5, part (d), if "0" is written by the write unit, "0" in the second magnetic section of the magnetic storage thin line MML is shifted to the third magnetic section, "1" in the first magnetic section is shifted to the second magnetic section, and "0" is written to the first magnetic section.

In the same manner as in subsequent writing, the previously written data is shifted away from the write position, and data is written to the first magnetic section as illustrated in FIG. 5, parts (e) to (i).

Next, a read sequence will be described. FIGS. 6A to 6D are schematic diagrams of reading with respect to the magnetic storage thin line MML. In reading, a read current flows through the magnetic storage thin line MML, and "1" stored in the first magnetic section of the magnetic storage thin line MML is read by the read unit, as illustrated in FIG. 5, part (j).

Figure 6:
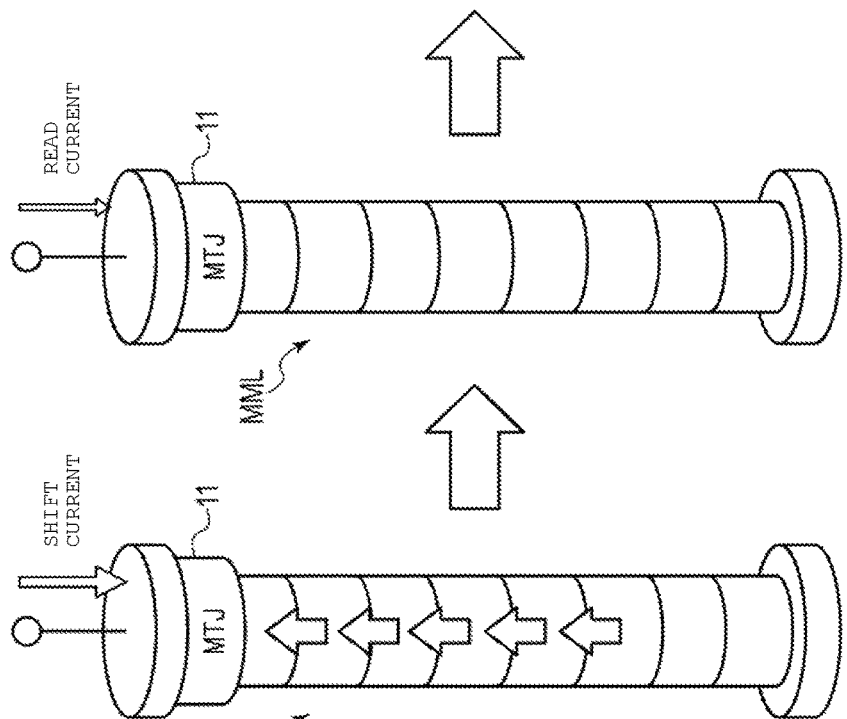
FIGS. 6A to 6D are schematic diagrams when reading from the magnetic storage thin line according to the first embodiment.

Next, as illustrated in FIG. 6A, a shift current flows through the magnetic storage thin line MML, and the magnetic domains of the magnetic storage thin line MML are shifted in a direction close to the read position. As a result, as illustrated in FIG. 5, part (k), for example, "0" of the second magnetic section exiting before reading is shifted to the first magnetic section, and "1" of the third magnetic section is shifted to the second magnetic section. Subsequently, as illustrated in FIG. 5, part (k) and FIG. 6B, a read current flows through the magnetic storage thin line MML, and the read unit reads "0" stored in the first magnetic section of the magnetic storage thin line MML.

Next, as illustrated in FIG. 6C, a shift current flows through the magnetic storage thin line MML, and the magnetic domain in the magnetic storage thin line MML is shifted in a direction approaching the read position. As a result, as illustrated in FIG. 5, part (l), for example, in the reading illustrated in FIG. 5, part (k), "1" in the second magnetic section is shifted to the first magnetic section and "0" in the third magnetic section is shifted to the second magnetic section. Subsequently, as illustrated in FIG. 5, part (l) and FIG. 6D, a read current flows through the magnetic storage thin line MML, and the read unit reads "1" stored in the first magnetic section of the magnetic storage thin line MML.

In the same manner as in the subsequent reading, each magnetic domain (or each domain wall) of the magnetic storage thin line MML is shifted in the direction approaching the read position and data stored in the first magnetic section is read, as illustrated in FIG. 5, parts (m) to (r).

1-2-1. Read Operation

Next, an outline of the reading method of the magnetic storage device according to the first embodiment will be described with reference to FIGS. 7A to 7D. FIGS. 7A to 7D are diagrams illustrating the reading method of the magnetic storage device, and schematically illustrate the magnetoresistance effect element (for example, MTJ element) 11 and the magnetic storage thin line MML.

A positional relationship between the magnetic layer 11S of the magnetoresistance effect element 11 and a read position RP is set by a magnetic induction (or an induced magnetic field) from a magnetic domain existing at the read position RP to the magnetic layer 11S of the magnetoresistance effect element 11 such that the magnetic layer 11S has the same magnetization direction as the magnetic domain at the read position RP.

Figure 7:
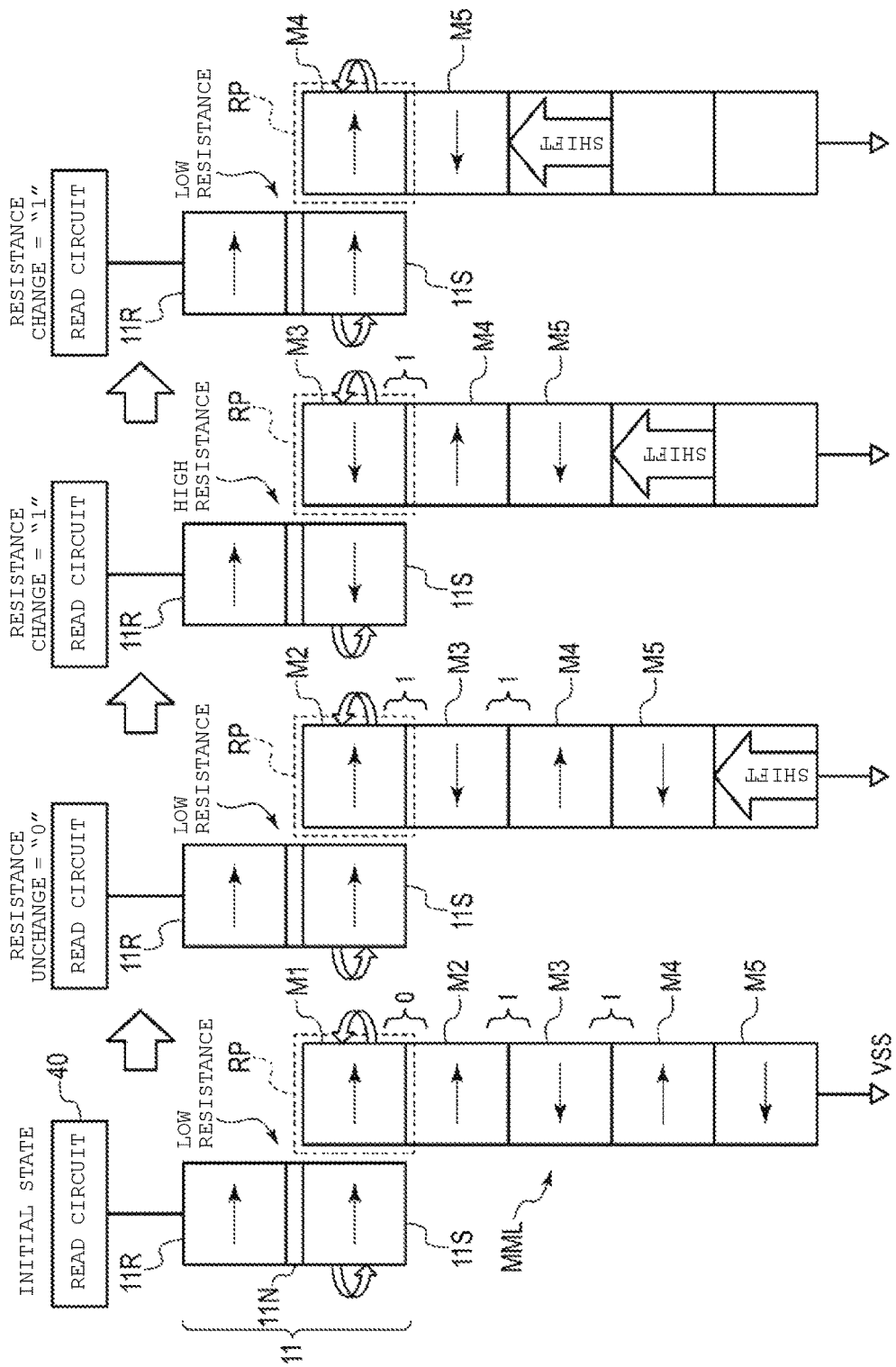
FIGS. 7A to 7D are diagram illustrating a method of reading from the magnetic storage device according to the first embodiment.
Figure 8:
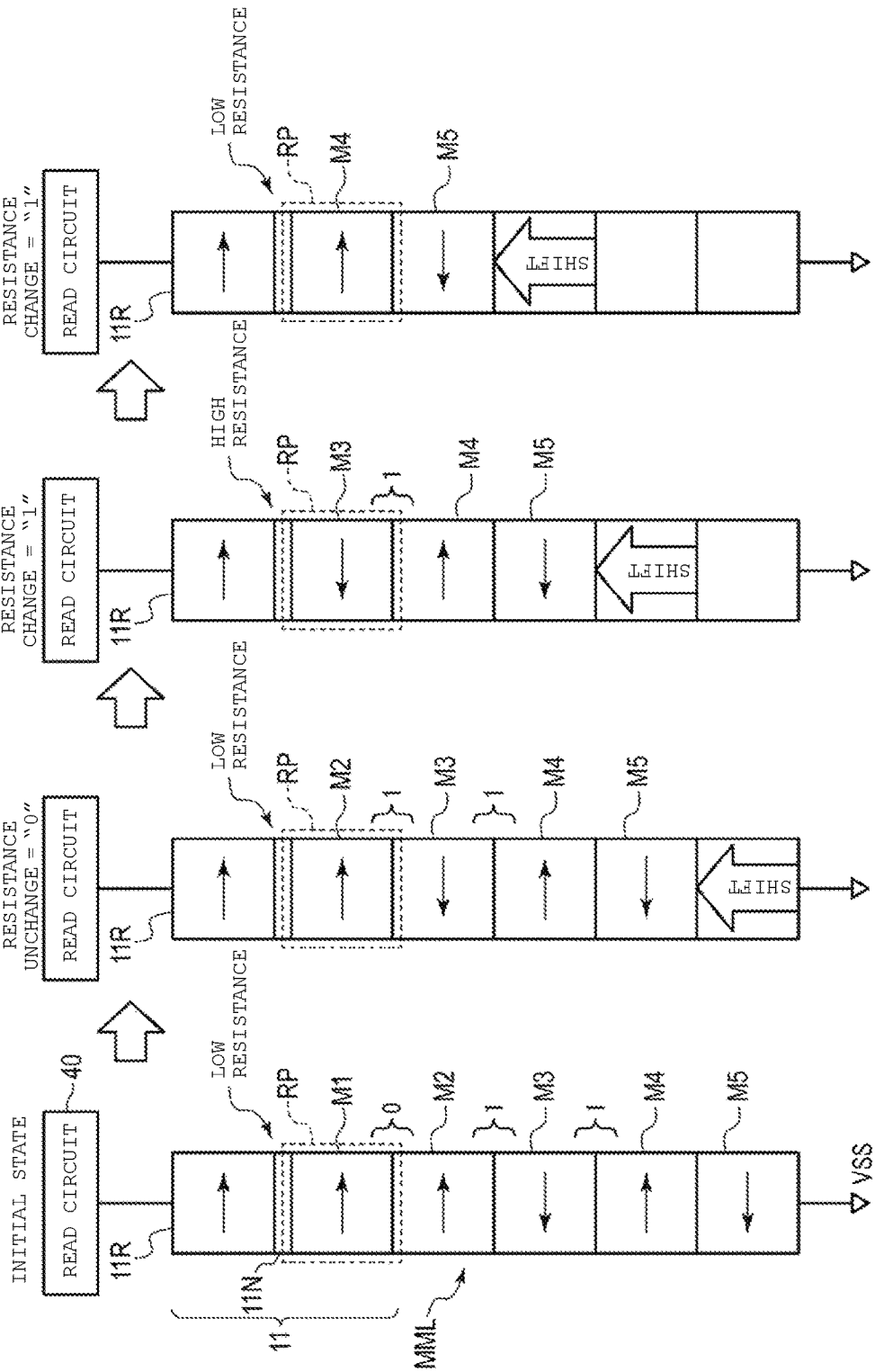
FIGS. 8A to 8D are diagrams illustrating the method of reading from the magnetic storage device according to the first embodiment.

In an initial state illustrated in FIG. 7A, the magnetic domain M1 is disposed at the read position RP, and the magnetic domains M2, M3, M4 and M5 are sequentially arranged in a direction far away from the read position RP. At this time, the magnetic layer 11S maintains the same magnetization direction as the magnetic domain M1 by the magnetic induction from the magnetic domain M1 disposed at the read position RP. Thereby, the magnetic layer 11S of the magnetoresistance effect element 11 has a magnetization direction parallel (in the same direction) to the magnetic layer 11R. Thereby, an electric resistance of the magnetoresistance effect element 11 becomes low resistance, and the read circuit 40 senses that the magnetoresistance effect element 11 is in a low resistance state.

Next, as illustrated in FIG. 7B, the magnetic domain of the magnetic storage thin line MML is shifted in the direction of the read position RP, and the magnetic domain M2 is set in the read position RP. The magnetic layer 11S maintains the same magnetization direction as the magnetic domain M2 by the magnetic induction from the magnetic domain M2 disposed at the read position RP. As a result, the magnetic layer 11S has a magnetization direction parallel to the magnetic layer 11R. Accordingly, in the same manner as in the case of FIG. 7A, the electric resistance of the magnetoresistance effect element 11 becomes a low resistance, and the read circuit 40 senses that the magnetoresistance effect element 11 is in the low resistance state.

In this way, if both the first sensing illustrated in FIG. 7A and the second sensing illustrated in FIG. 7B are in the low resistance state, the read circuit 40 outputs, for example, "0". That is, "0" is output as the data stored in the magnetic domains M1 and M2. Here, although a case where both the first sensing and the second sensing are in the low resistance state, the read circuit 40 outputs "0" also in a case where both the first sensing and the second sensing are in a high resistance state.

Next, as illustrated in FIG. 7C, the magnetic domain of the magnetic storage thin line MML is shifted in the direction of the read position RP, and the magnetic domain M3 is set in the read position RP. The magnetic layer 11S maintains the same magnetization direction as the magnetic domain M3 by the magnetic induction from the magnetic domain M3 disposed at the read position RP. As a result, the magnetic layer 11S has a magnetization direction antiparallel (in the opposite direction) to the magnetic layer 11R. Accordingly, the electric resistance of the magnetoresistance effect element 11 becomes a high resistance, and the read circuit 40 senses that the magnetoresistance effect element 11 is in the high resistance state.

In this way, in a case where the second sensing illustrated in FIG. 7B and the third sensing illustrated in FIG. 7C are different resistance states from each other, the read circuit 40 outputs, for example, "1". That is, "1" is output as the data stored in the magnetic domains M2 and M3.

Next, as illustrated in FIG. 7D, the magnetic domain of the magnetic storage thin line MML is shifted in the direction of the read position RP, and the magnetic domain M4 is set in the read position RP. The magnetic layer 11S maintains the same magnetization direction as the magnetic domain M4 by the magnetic induction from the magnetic domain M4 disposed at the read position RP. As a result, the magnetic layer 11S has a magnetization direction parallel to the magnetic layer 11R. Accordingly, the electric resistance of the magnetoresistance effect element 11 becomes a low resistance, and the read circuit 40 senses that the magnetoresistance effect element 11 is in the low resistance state.

In this way, in a case where the third sensing illustrated in FIG. 7C and the fourth sensing illustrated in FIG. 7D are different resistance states from each other, the read circuit 40 outputs "1", for example. That is, "1" is output as the data stored in the magnetic domains M3 and M4.

In the reading method according to the first embodiment, in a case where the resistance state sensed by the previous reading and the resistance state sensed by the current reading are the same, it is determined as the first data (for example, "0"). Meanwhile, in a case where the resistance state sensed by the previous reading is different from the resistance state sensed by the current reading, it is determined as the second data (for example, "1"). That is, in a case where both the low resistance states or both the high resistance states are sensed by two consecutive reading, it is determined as the first data, and in a case where different resistance states are sensed, it is determined as the second data. In other words, in a case where the resistance of the magnetoresistance effect element 11 with respect to the two adjacent magnetic domains in the magnetic storage thin line MML is sensed and the resistance of the magnetoresistance effect element 11 does not change, it is determined as the first data, and in a case where the resistance of the magnetoresistance effect element 11 changes, it is determined as the second data.

Next, a reading method according to the first embodiment will be described with reference to FIGS. 8A to 8D. FIGS. 8A to 8D schematically illustrate the thin line MML of the magnetoresistance effect element (for example, MTJ element).

In the mechanism illustrated in FIGS. 8A to 8D, the magnetic domains of the magnetic storage thin line MML are arranged instead of the magnetic layer (storage layer) 11S of the magnetoresistance effect element 11 illustrated in FIGS. 7A to 7D. That is, the position of the magnetic layer 11S illustrated in FIGS. 7A to 7D becomes the read position RP, and the magnetic domain to be read in the magnetic storage thin line MML is disposed at the read position RP. As a result, the magnetic domain disposed at the read position RP functions as a storage layer of the magnetoresistance effect element 11.

If the magnetic domain disposed at the read position RP has a magnetization direction parallel (in the same direction) to the magnetic layer 11R, the electric resistance of the magnetoresistance effect element 11 becomes a low resistance. The read circuit 40 senses that the magnetoresistance effect element 11 is in the low resistance state.

Meanwhile, if the magnetic domain disposed at the read position RP has a magnetization direction antiparallel (in the opposite direction) to the magnetic layer 11R, the electric resistance of the magnetoresistance effect element 11 becomes a high resistance. The read circuit 40 senses that the magnetoresistance effect element 11 is in the high resistance state.

Shift of the magnetic domains of the other magnetic storage thin line MML, determination of the data based on the resistance state of the magnetoresistance effect element 11, and the like are the same as the reading method illustrated in FIGS. 7A to 7D described above.

Next, details of the read operation of the magnetic storage device according to the first embodiment will be described. First, the read circuit 40 used for the read operation will be described.

Figure 9:
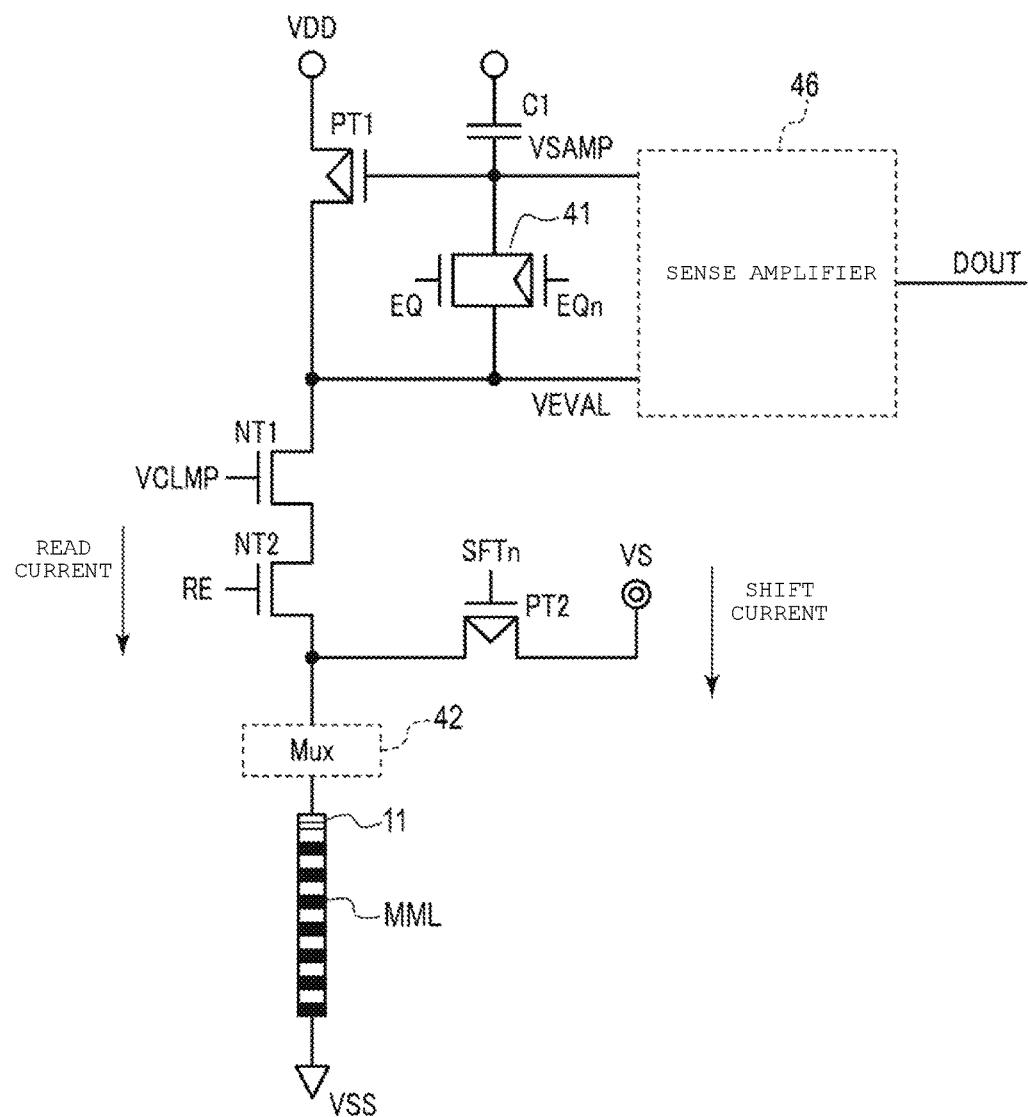
FIG. 9 is a circuit diagram illustrating a configuration of a read circuit according to the first embodiment.

FIG. 9 is a circuit diagram illustrating a configuration of the read circuit according to the first embodiment. The read circuit 40 includes a capacitor C1, a sense amplifier 46, an equalization circuit 41, a multiplexer (Mux) 42, p channel type MOS transistors (hereinafter, referred to as pMOS transistors) PT1 and PT2, and n channel type MOS transistors (hereinafter, referred to as nMOS transistor) NT1 and NT2.

Hereinafter, a circuit connection of the read circuit illustrated in FIG. 9 will be described. A first input terminal of the sense amplifier 46 is connected to a first electrode of the capacitor C1, a gate of the pMOS transistor PT1, and a first terminal of the equalization circuit 41. A second input terminal of the sense amplifier 46 is connected to a drain of the pMOS transistor PT1, a drain of the nMOS transistor NT1, and a second terminal of the equalization circuit 41. A source of the nMOS transistor NT1 is connected to a drain of the pMOS transistor PT2 via the nMOS transistor NT2 and an input terminal of the multiplexer 42. A second electrode of the capacitor C1 and a source of the pMOS transistor PT1 are supplied with a power supply voltage VDD. Furthermore, a shift voltage VS is supplied to a source of the pMOS transistor PT2.

A shift signal SFTn is input to a gate of the pMOS transistor PT2. A clamp signal VCLMP is input to a gate of the nMOS transistor NT1, and a read enable signal RE is input to a gate of the nMOS transistor NT2. Equalization signals EQ and EQn are input to gates of the transistors of the equalization circuit 41. An output signal DOUT is output from the sense amplifier 46. The "n" attached to a symbol of the signal indicates that the signal is active when its signal level is low.

In addition, an output terminal of the multiplexer 42 is connected to a reference voltage terminal VSS via the magnetoresistance effect element 11 and the magnetic storage thin line MML.

In the read circuit 40, a circuit in a preceding stage of the sense amplifier 46 functions as a preamplifier that senses a resistance state of the magnetoresistance effect element 11. The preamplifier stores a state signal corresponding to the resistance state of the magnetoresistance effect element 11 in the capacitor C1.

Figure 10:
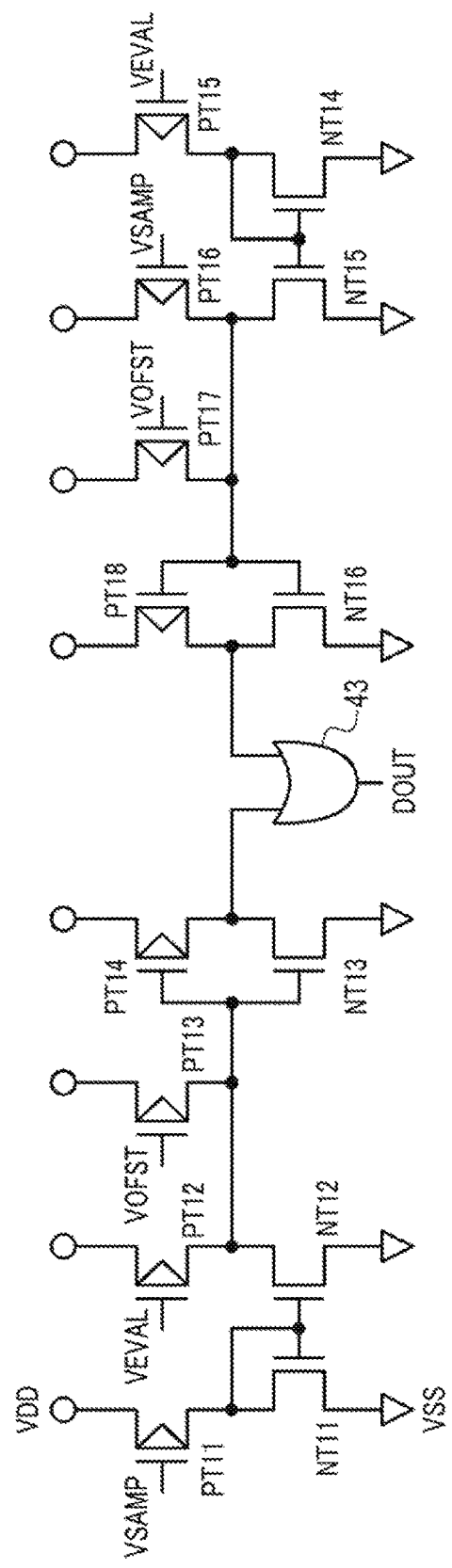
FIG. 10 is a circuit diagram illustrating a configuration of a sense amplifier according to the first embodiment.

FIG. 10 is a circuit diagram illustrating a configuration of the sense amplifier 46 of the read circuit 40. The sense amplifier 46 includes pMOS transistors PT11 to PT18, nMOS transistors NT11 to NT16, and an OR circuit 43.

Hereinafter, a circuit connection of the sense amplifier 46 illustrated in FIG. 10 will be described.

The power supply voltage VDD is supplied to a source of the pMOS transistor PT11. A drain of the pMOS transistor PT11 is connected to a drain and a gate of the nMOS transistor NT11. A source of the nMOS transistor NT11 is connected to a reference voltage terminal VSS.

The power supply voltage is supplied to sources of the pMOS transistors PT12 and PT13. A drain of the pMOS transistor PT12 is connected to a drain of the nMOS transistor NT12, a drain of the pMOS transistor PT13, and gates of the pMOS transistor PT14 and the nMOS transistor NT13. A source of the nMOS transistor NT12 is connected to the reference voltage terminal VSS.

The power supply voltage VDD is supplied to a source of the pMOS transistor PT14. A drain of the pMOS transistor PT14 is input to a drain of the nMOS transistor NT13 and a first input terminal of the OR circuit 43. A source of the nMOS transistor NT13 is connected to the reference voltage terminal VSS.

The power supply voltage VDD is supplied to a source of the pMOS transistor PT15. A drain of the pMOS transistor PT15 is connected to a drain and a gate of the nMOS transistor NT14 and a gate of the nMOS transistor NT15. A source of the nMOS transistor NT14 is connected to the reference voltage terminal VSS.

The power supply voltage VDD is supplied to sources of the pMOS transistors PT16 and PT17. A drain of the pMOS transistor PT16 is connected to a drain of the nMOS transistor NT15, a drain of the pMOS transistor PT17, and gates of the pMOS transistor PT18 and the nMOS transistor NT16. A source of the nMOS transistor NT15 is connected to the reference voltage terminal VSS.

The power supply voltage VDD is supplied to a source of the pMOS transistor PT18. A drain of the pMOS transistor PT18 is input to a drain of the nMOS transistor NT16 and a second input terminal of the OR circuit 43. A source of the nMOS transistor NT16 is connected to the reference voltage terminal VSS.

Gates of the pMOS transistors PT11 and PT16 correspond to the first input terminal of the sense amplifier 46. A voltage VSAMP is input to gates of the pMOS transistors PT11 and PT16. Gates of the pMOS transistors PT12 and PT15 correspond to the second input terminal of the sense amplifier 46. A state signal VEVAL is input to the gates of the pMOS transistors PT12 and PT15. An offset voltage VOFST is input to gates of the pMOS transistors PT13 and PT17. Furthermore, a signal DOUT is output from an output terminal of the OR circuit 43.

The pMOS transistors PT13 and PT17 to which the offset voltage VOFST is input are provided for correcting errors occurring at the time of comparing state signals due to temperature characteristics of elements, manufacturing variations, and the like. Specifically, the sense amplifier 46 outputs, for example, "L" if a difference between the state signal VEVAL and the voltage VSAMP is equal to or less than a threshold voltage, and outputs "H" if the difference is larger than the threshold voltage. The offset voltage VOFST sets the threshold voltage at this time.

Figure 11:
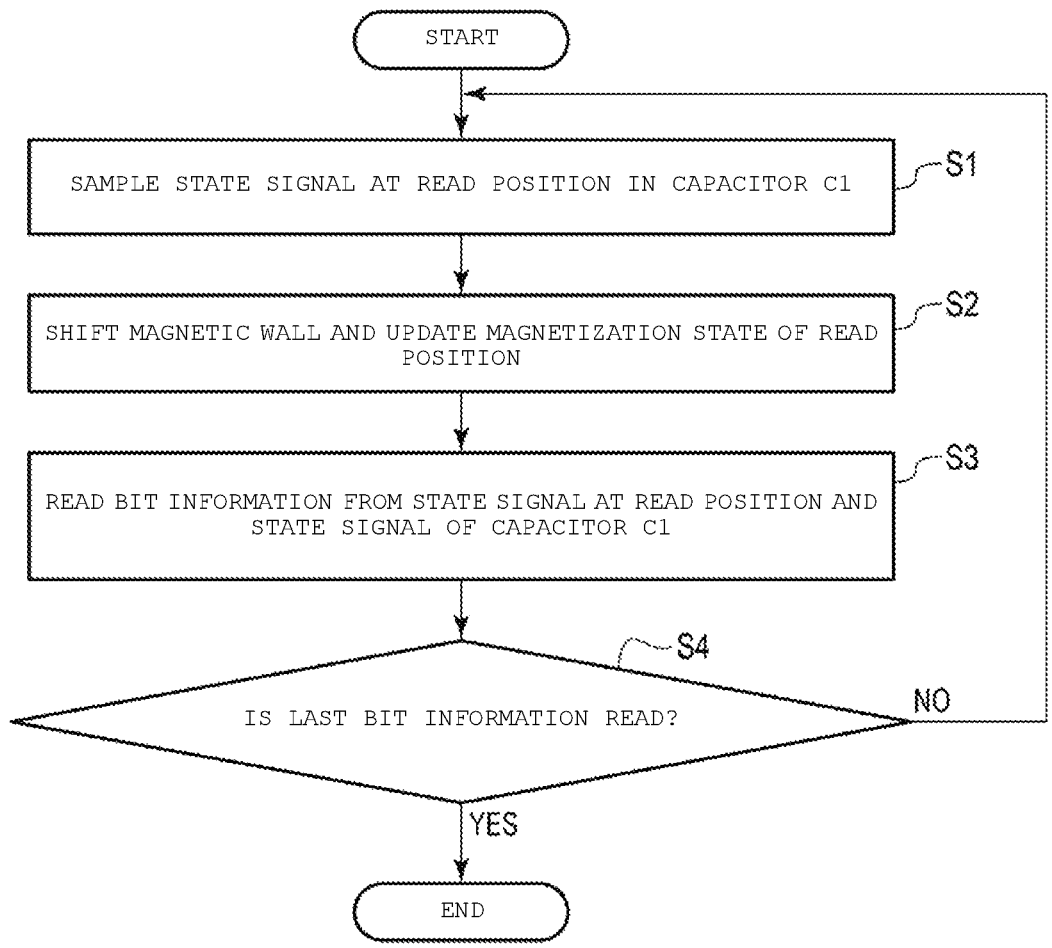
FIG. 11 is a flowchart illustrating a read operation according to the first embodiment.

Next, an outline of the read operation according to the first embodiment will be described with reference to FIG. 11. FIG. 11 is a flowchart illustrating the read operation. The read operation is performed by the controller 70.

The resistance of the magnetoresistance effect element (for example, the MTJ element) 11 changes to the low resistance state or the high resistance state depending on the magnetization direction of the magnetic domain M1 at the read position RP. The state signal VEVAL corresponding to the resistance of the magnetoresistance effect element 11 which changes depending on the magnetization direction of the magnetic domain M1 is sampled in the capacitor C1 (step S1).

Next, the magnetic domains (or magnetic walls) are shifted and the magnetic domains existing at the read position RP are updated. For example, as described above, the magnetic domain M2 is shifted to the read position RP and the magnetic domain M3 is shifted to a position of the magnetic domain M2 (step S2).

Next, the state signal VEVAL corresponding to the resistance of the magnetoresistance effect element 11 which changes depending on the magnetization direction of the magnetic domain M2 is obtained. Subsequently, the state signal according to the magnetic domain M2 shifted to the read position RP and the state signal (state signal of the previous magnetic domain M1) stored in the capacitor C1 are compared with each other, and bit information stored between the magnetic domain M1 and the magnetic domain M2 is read, based on the comparison result (step S3).

Next, it is determined whether or not the last bit information is read (step S4). In a case where the last bit information is not read (No), the processing returns to step S1 and the operations after step S1 are repeated. Meanwhile, in a case where the last bit information is previously read (Yes), the read operation ends.

Figure 12:
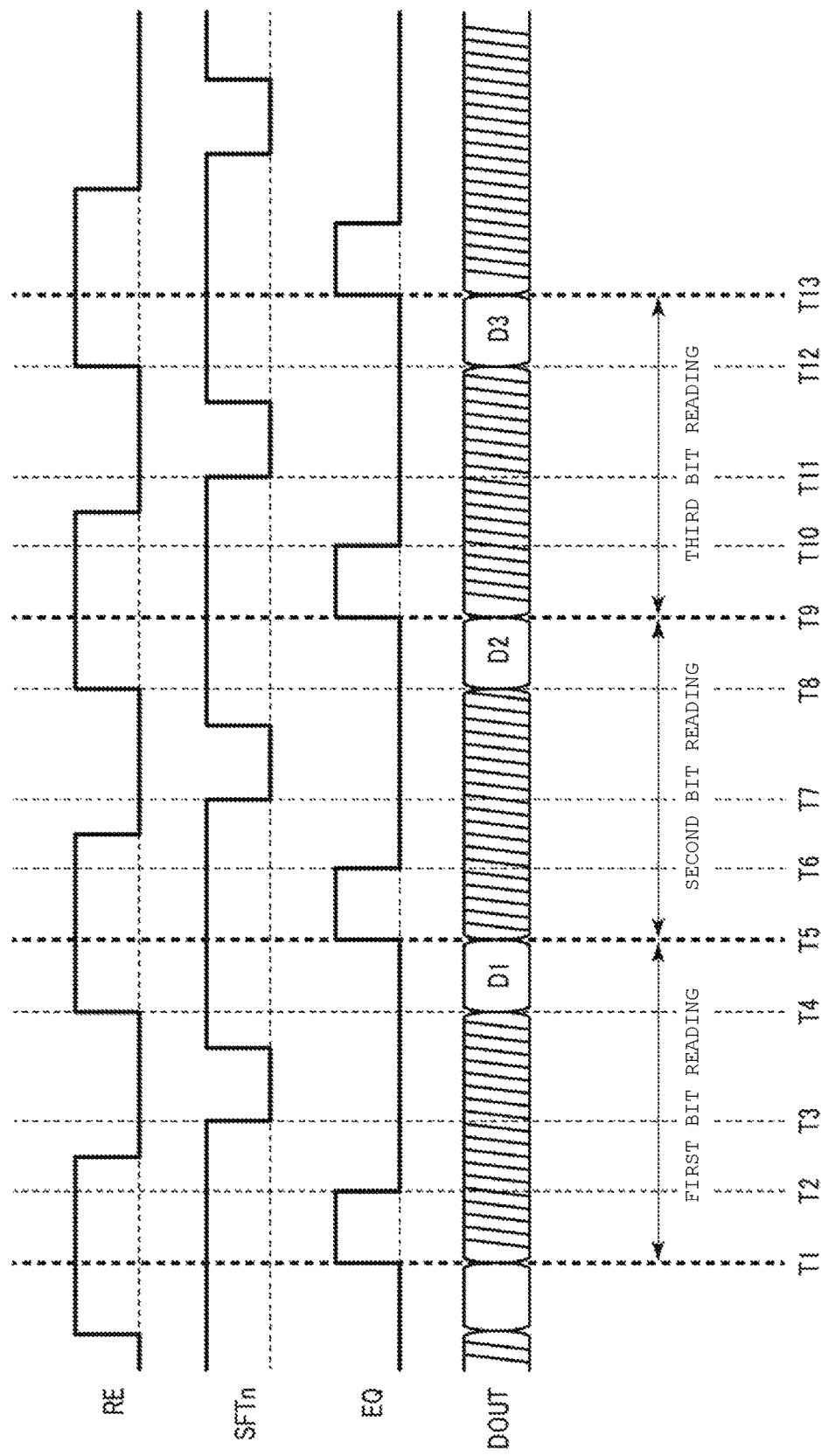
FIG. 12 is a timing chart of each signal of the read operation according to the first embodiment.

Next, the read operation will be described in detail with reference to FIG. 12. FIG. 12 is a timing chart of each signal in the read operation. Description on the clamp signal VCLMP will be omitted.

First, the shift signal SFTn, the read enable signal RE, and the equalization signal EQ are all negated. That is, the shift signal SFTn goes to "H", and the read enable signal RE and the equalization signal EQ go to "L".

Here, before time T1, the read enable signal RE is asserted (for example, "H"). Thereby, the state signal VEVAL corresponding to the resistance of the magnetoresistance effect element 11 which changes depending on the magnetization direction of the magnetic domain M1 is obtained. Subsequently, at time T1, the equalization signal EQ is asserted (for example, "H"). Thereby, the equalization circuit 41 is activated, and the voltage VSAMP becomes the same potential as the state signal VEVAL.

Next, at time T2, the equalization signal EQ is negated (for example, "L"). Thereby, the equalization circuit 41 is deactivated, and the voltage VSAMP is sampled in the capacitor C1.

Next, the read enable signal RE is negated (for example, "L"). Further, at time T3, the shift signal SFTn is asserted (for example, "L"). As a result, a shift current flows through the magnetic storage thin line MML, and the magnetic domain of the magnetic storage thin line MML is shifted in the direction of the read position RP. As a result, the magnetic domain M2 is shifted to the read position RP.

Next, after the shift signal SFTn is negated (for example, "H"), the read enable signal RE is asserted (for example, "H") at time T4. As a result, the resistance of the magnetoresistance effect element 11 changes to the low resistance state or the high resistance state depending on the magnetization direction of the magnetic domain M2 shifted to the read position RP. As a result, the state signal VEVAL corresponding to the resistance of the magnetoresistance effect element 11 is obtained. Then, the sense amplifier 46 compares the state signal VEVAL with the voltage VSAMP, and outputs data D1 of the signal DOUT, based on the comparison result. In a case where the state signal VEVAL and the voltage VSAMP are substantially the same, that is, in a case where a difference between the state signal VEVAL and the voltage VSAMP is less than or equal to a threshold voltage, the sense amplifier 46 outputs "L". Meanwhile, in a case where the state signal VEVAL is different from the voltage VSAMP, that is, in a case where the difference between the state signal VEVAL and the voltage VSAMP is larger than the threshold voltage, the sense amplifier 46 outputs "H".

Thereafter, operations from time T5 to time T8 and from time T9 to time T12 are performed in the same manner as the above-described operations from time T1 to time T4, the state signal VEVAL and the voltage VSAMP are compared, and data D2 and D3 of the signal DOUT are respectively output, based on the comparison result.

1-3. Effect of First Embodiment

According to the first embodiment, it is possible to provide a magnetic storage device capable of performing a stable read operation.

Hereinafter, effects of the first embodiment will be described in detail. The magnetic storage device according to the first embodiment includes the magnetic storage thin line MML, the magnetoresistance effect element 11, and the read circuit 40. The magnetic storage thin line MML is a linear magnetic body and includes a plurality of magnetic domains including the first magnetic domain and the second magnetic domain adjacent to each other in the direction in which the magnetic body extends. The magnetization directions of the plurality of magnetic domains are variable. The magnetoresistance effect element 11 has either a first resistance depending on the magnetization direction of the first magnetic domain or a second resistance depending on the magnetization direction of the second magnetic domain. The read circuit 40 senses the first resistance and the second resistance of the magnetoresistance effect element 11 and compares the first resistance with the second resistance. The read circuit 40 outputs first data when the first resistance and the second resistance are unchanged, and outputs the second data when the first resistance and the second resistance are different from each other (or when changed).

In the first embodiment, whether the resistance states depending on the first magnetic domain and the second magnetic domain adjacent to each other in the same magnetic storage thin line MML are unchanged or different from each other is detected. The data stored in each magnetic domain is not determined by the resistance states depending on each magnetic domain, and the stored data is determined by two adjacent magnetic domains depending on whether each resistance state depending on the two adjacent magnetic domains is unchanged or changed. In this way, according to the first embodiment, whether or not the resistance state changes is detected, and thus, it is possible to perform a stable read operation strong against a variation in magnetization of the magnetic domains of the magnetic storage thin line MML.

2. Second Embodiment

In a second embodiment, data is read from resistance depending on a magnetization direction of a magnetic domain by using another read circuit. Hereinafter, points different from the first embodiment will be mainly described.

2-1. Read Operation

A read operation of the magnetic storage device 1 according to the second embodiment will be described. First, the read circuit 40 used for the read operation will be described.

Figure 13:
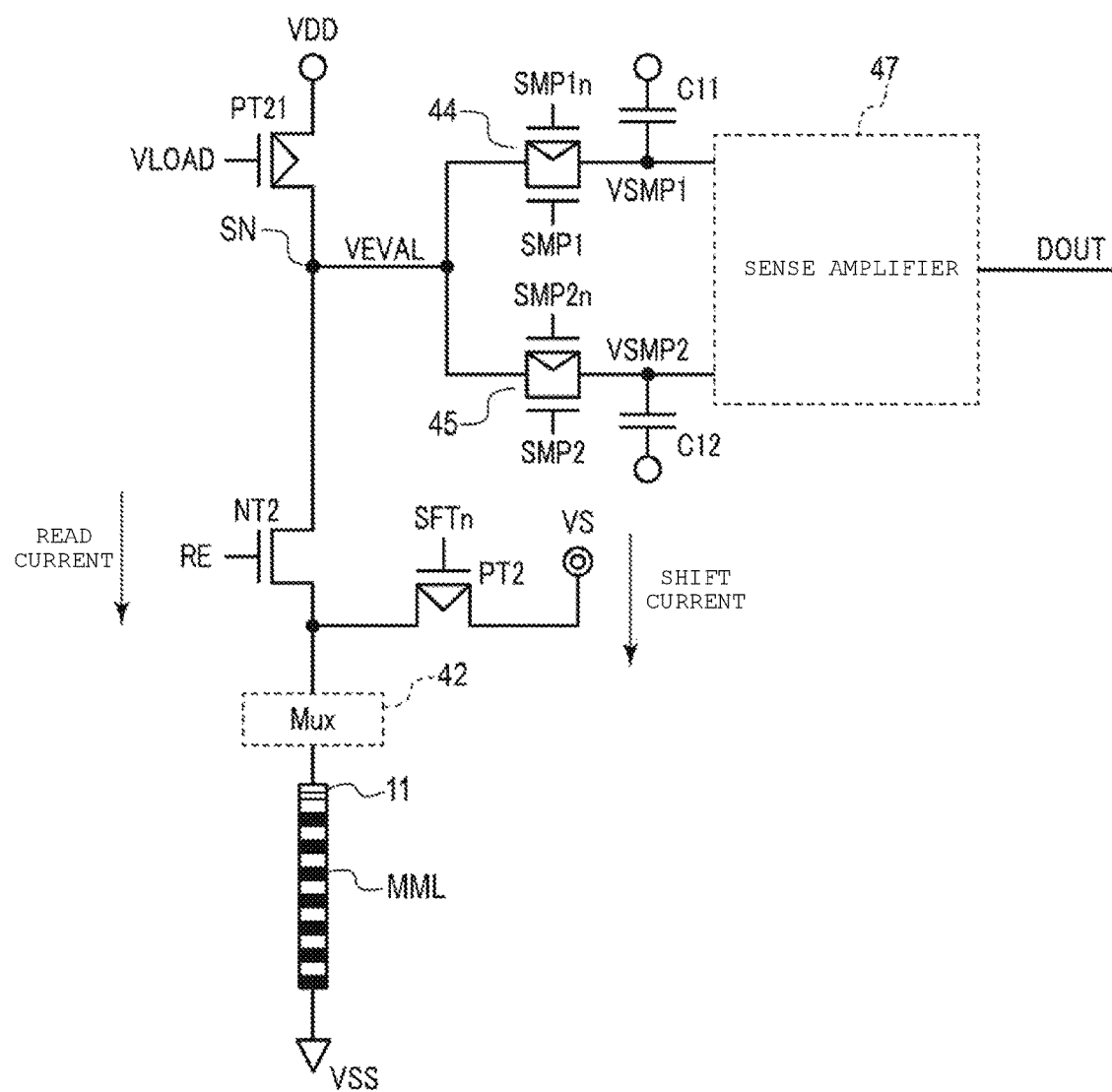
FIG. 13 is a circuit diagram illustrating a configuration of a read circuit according to a second embodiment.

FIG. 13 is a circuit diagram illustrating a configuration of the read circuit according to the second embodiment. The read circuit 40 includes capacitors C11 and C12, a sense amplifier 47, pass transistors 44 and 45, a multiplexer 42, pMOS transistors PT2 and PT21, and an nMOS transistor NT2.

Hereinafter, a circuit connection of the read circuit illustrated in FIG. 13 will be described. A first input terminal of the sense amplifier 47 is connected to a first electrode of the capacitor C11 and a first terminal of the pass transistor 44. A second input terminal of the sense amplifier 47 is connected to a first electrode of the capacitor C12 and a first terminal of the pass transistor 45.

A drain of the pMOS transistor PT21 is connected to second terminals of the pass transistors 44 and 45. A drain of the pMOS transistor PT21 is also connected to a drain of the pMOS transistor PT2 via the nMOS transistor NT2 and an input terminal of the multiplexer 42.

The power supply voltage VDD is supplied to second electrodes of the capacitors C11 and C12 and a source of the pMOS transistor PT21. Furthermore, the shift voltage VS is supplied to a source of the pMOS transistor PT2.

A shift signal SFTn is input to a gate of the pMOS transistor PT2. Sample signals SMP1 and SMP1n are input to gates of the pass transistor 44, respectively. Sample signals SMP2 and SMP2n are input to gates of the pass transistor 45. A read enable signal RE is input to a gate of the nMOS transistor NT2. A load signal VLOAD is input to a gate of the pMOS transistor PT21. A voltage of the first input terminal of the sense amplifier 47 is referred to as VSMP1 and a voltage of the second input terminal thereof is referred to as VSMP2. Furthermore, an output signal DOUT is output from the sense amplifier 47.

In the read circuit 40, a circuit in a preceding stage of the sense amplifier 47 functions as a preamplifier that senses a resistance state of the magnetoresistance effect element 11. The preamplifier stores state signals depending on the resistance state of the magnetoresistance effect element 11 in the capacitors C11 and C12.

In addition, the pMOS transistor PT21 to which a load signal VLOAD is input performs a constant current control to make the read current constant. Accordingly, it is possible to prevent an excessive current from flowing through the selection element 12, the magnetoresistance effect element 11, and the magnetic storage thin line MML. Further, in the circuit illustrated in FIG. 13, the nMOS transistor NT1 can be removed, and thus, an area of the circuit can be reduced as compared with the circuits illustrated in FIGS. 14 and 15 which will be described below.

Figure 14:
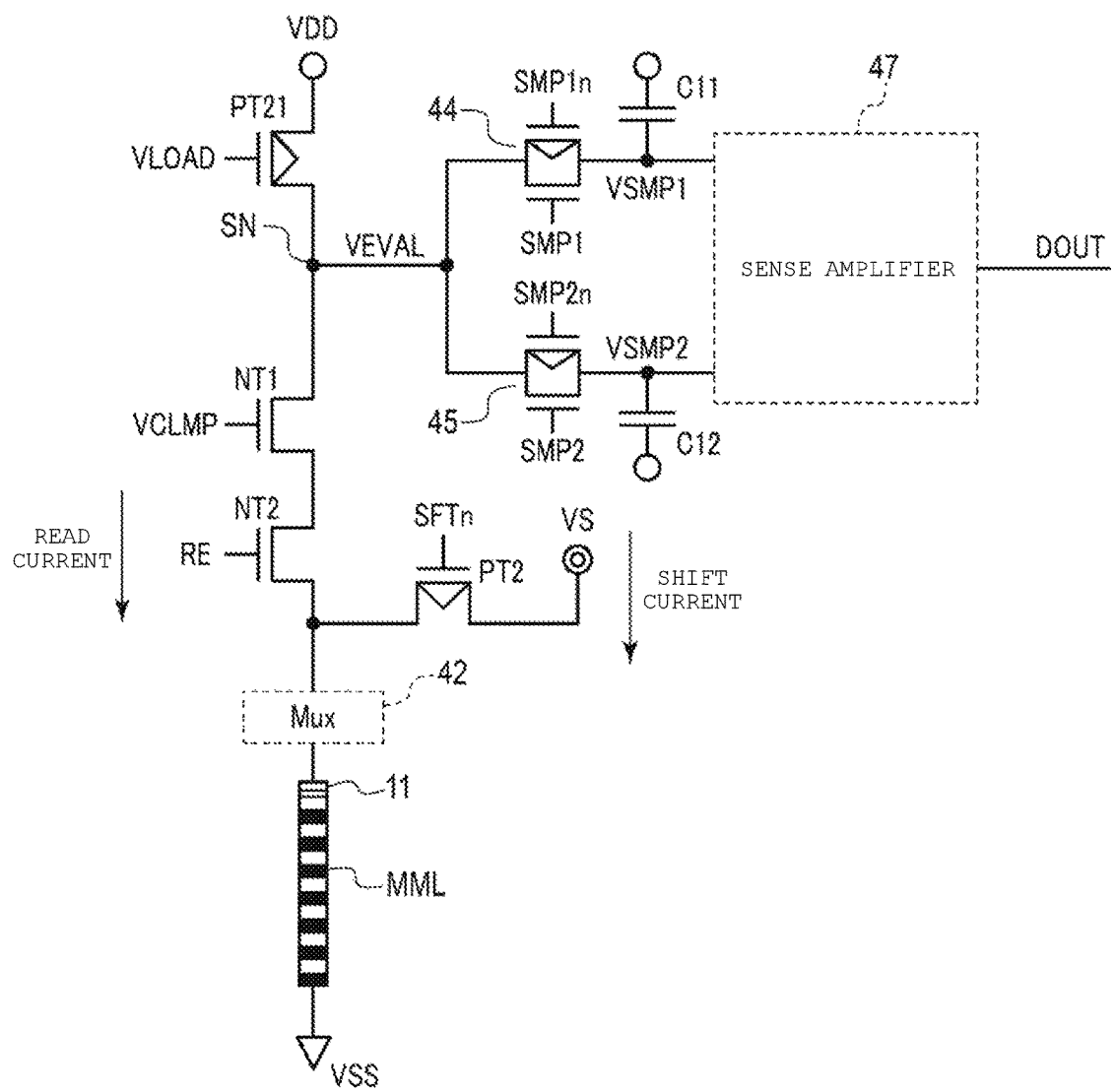
FIG. 14 is a circuit diagram illustrating a configuration of a read circuit according to a modification example of the second embodiment.

FIG. 14 is a circuit diagram illustrating a configuration of a read circuit according to a modification example. The modification example is an example in which the nMOS transistor NT1 is connected between the drain of the pMOS transistor PT21 and the drain of the nMOS transistor NT2 in the circuit illustrated in FIG. 13. The clamp signal VCLMP is input to a gate of the nMOS transistor NT1. The other configuration is the same as the configuration illustrated in FIG. 13.

The pMOS transistor PT21 to which the load signal VLOAD is input performs a constant current control to make the read current constant. The nMOS transistor NT1 to which the clamp signal VCLMP is input performs a constant voltage control. Accordingly, it is possible to prevent an excessive current and an excessive voltage from being applied to the selection element 12, the magnetoresistance effect element 11, and the magnetic storage thin line MML.

Figure 15:
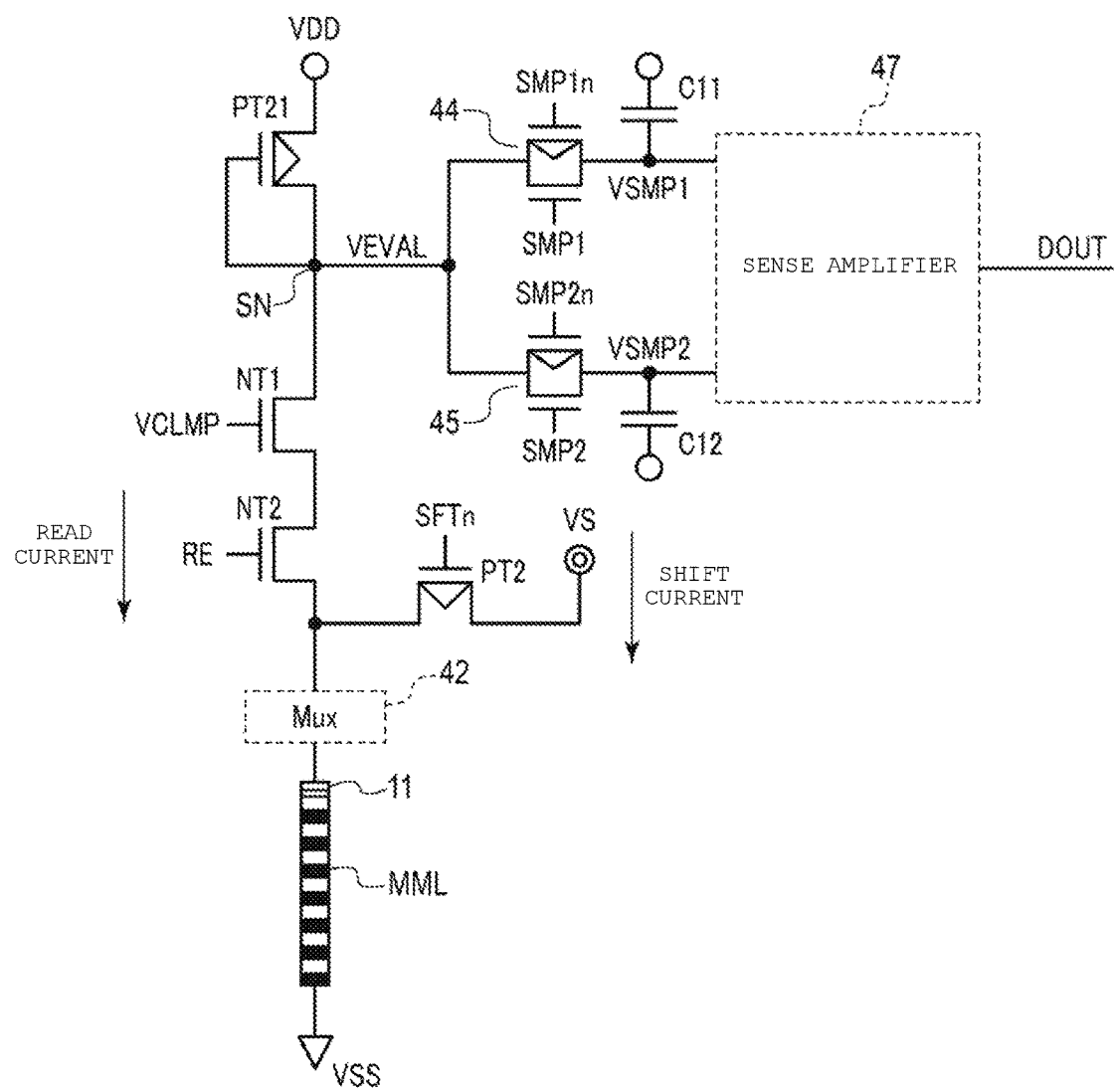
FIG. 15 is a circuit diagram illustrating a configuration of a read circuit according to another modification example of the second embodiment.

FIG. 15 is a circuit diagram illustrating a configuration of a read circuit of another modification example. In the modification example, instead of the load signal VLOAD input to the gate of the pMOS transistor PT21 in the circuit illustrated in FIG. 14, the gate of the pMOS transistor PT21 is connected to the drain thereof. The other configuration is the same as the configuration illustrated in FIG. 14.

The nMOS transistor NT1 to which the clamp signal VCLMP is input performs a constant voltage control. Accordingly, it is possible to prevent an excessive voltage from being applied to the selection element 12, the magnetoresistance effect element 11, and the magnetic storage thin line MML.

Figure 16:
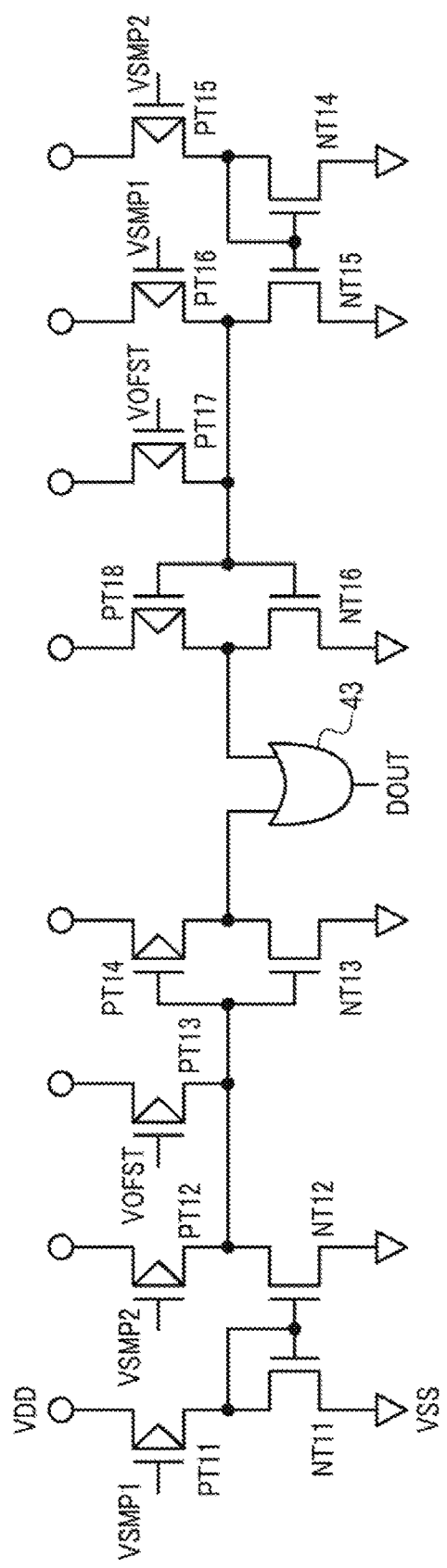
FIG. 16 is a circuit diagram illustrating a configuration of a sense amplifier according to the second embodiment.

FIG. 16 is a circuit diagram illustrating a configuration of the sense amplifier 47 in the read circuit 40 according to the second embodiment. In the sense amplifier 47, the voltage VSMP1 is input to the gate of pMOS transistor PT11 and the voltage VSMP2 is input to the gate of pMOS transistor PT12 in the circuit illustrated in FIG. 10. Furthermore, the voltage VSMP2 is input to the gate of the pMOS transistor PT15, and the voltage VSMP1 is input to the gate of the pMOS transistor PT16. The other configuration is the same as the configuration illustrated in FIG. 10.

Figure 17:
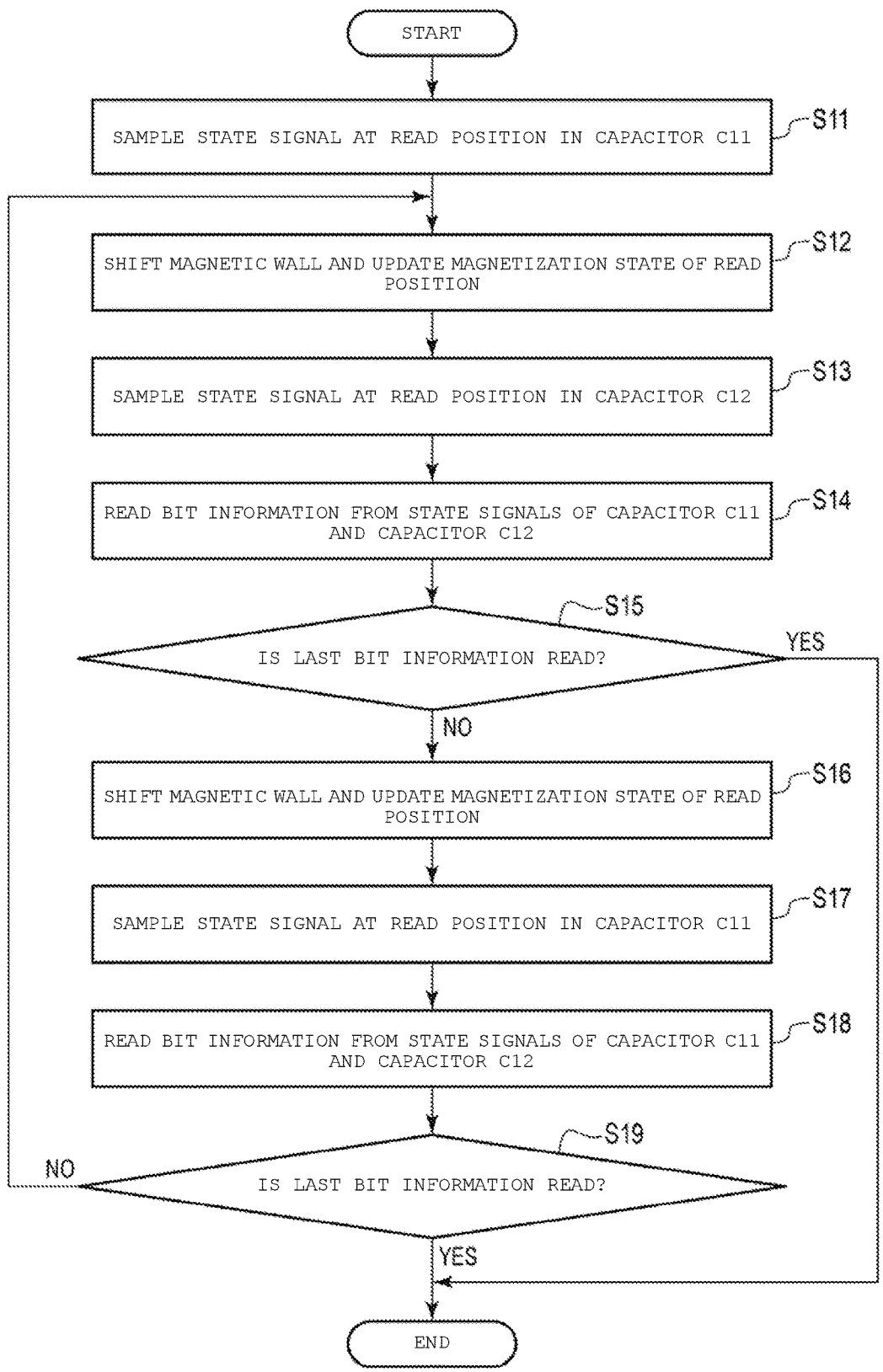
FIG. 17 is a flowchart illustrating a read operation according to the second embodiment.

Next, an outline of the read operation according to the second embodiment will be described with reference to FIG. 17. FIG. 17 is a flowchart illustrating the read operation. The read operation is performed by the controller 70.

The resistance of the magnetoresistance effect element 11 changes to a low resistance state or a high resistance state depending on the magnetization direction of the magnetic domain M1 at the read position RP. The state signal VEVAL corresponding to the resistance of the magnetoresistance effect element 11 which changes depending on the magnetization direction of the magnetic domain M1 is sampled in the capacitor C11 (step S11).

Next, the magnetic domains (or magnetic walls) are shifted and the magnetic domains existing at the read position RP are updated. For example, as described above, the magnetic domain M2 is shifted to the read position RP and the magnetic domain M3 is shifted to a position of the magnetic domain M2 (step S12).

Thereby, the resistance of the magnetoresistance effect element 11 changes to the low resistance or the high resistance depending on the magnetization direction of the magnetic domain M2 shifted to the read position RP. The state signal VEVAL corresponding to the resistance of the magnetoresistance effect element 11 which changes depending on the magnetization direction of the magnetic domain M2 is sampled in the capacitor C12 (step S13).

Next, the state signal (the state signal of the previous magnetic domain M1) stored in the capacitor C11 is compared with the state signal (the state signal of the current magnetic domain M2) stored in the capacitor C12, and the bit information stored between the magnetic domain M1 and the magnetic domain M2 is read based on the comparison result (step S14).

Next, it is determined whether or not the last bit information is read (step S15). If the last bit information is not read (No), the processing proceeds to step S16, and the processing after step S16 are performed. Meanwhile, if the last bit information is previously read (Yes), the read operation ends.

In step S16, the magnetic domain is shifted and the magnetic domain existing at the read position RP is updated. For example, after step S12, the magnetic domain M3 is shifted to the read position RP and the magnetic domain M4 is shifted to a position of the magnetic domain M3 (step S16).

Thereby, the resistance of the magnetoresistance effect element 11 changes to a low resistance or a high resistance depending on the magnetization direction of the magnetic domain M3 shifted to the read position RP. The state signal VEVAL corresponding to the resistance of the MTJ element 11 which changes depending on the magnetization direction of the magnetic domain M3 is sampled in the capacitor C11 (step S17).

Next, the state signal (the state signal of the previous magnetic domain M2) stored in the capacitor C12 is compared with the state signal (the state signal of the current magnetic domain M3) stored in the capacitor C11, and the bit information stored between the magnetic domain M2 and the magnetic domain M3 is read based on the comparison result (step S18).

Next, it is determined whether or not the last bit information is read (step S19). If the last bit information is not read (No), the processing returns to step S12 and the operations after step S12 are repeated. Meanwhile, if the last bit information is previously read (Yes), the read operation ends.

Figure 18:
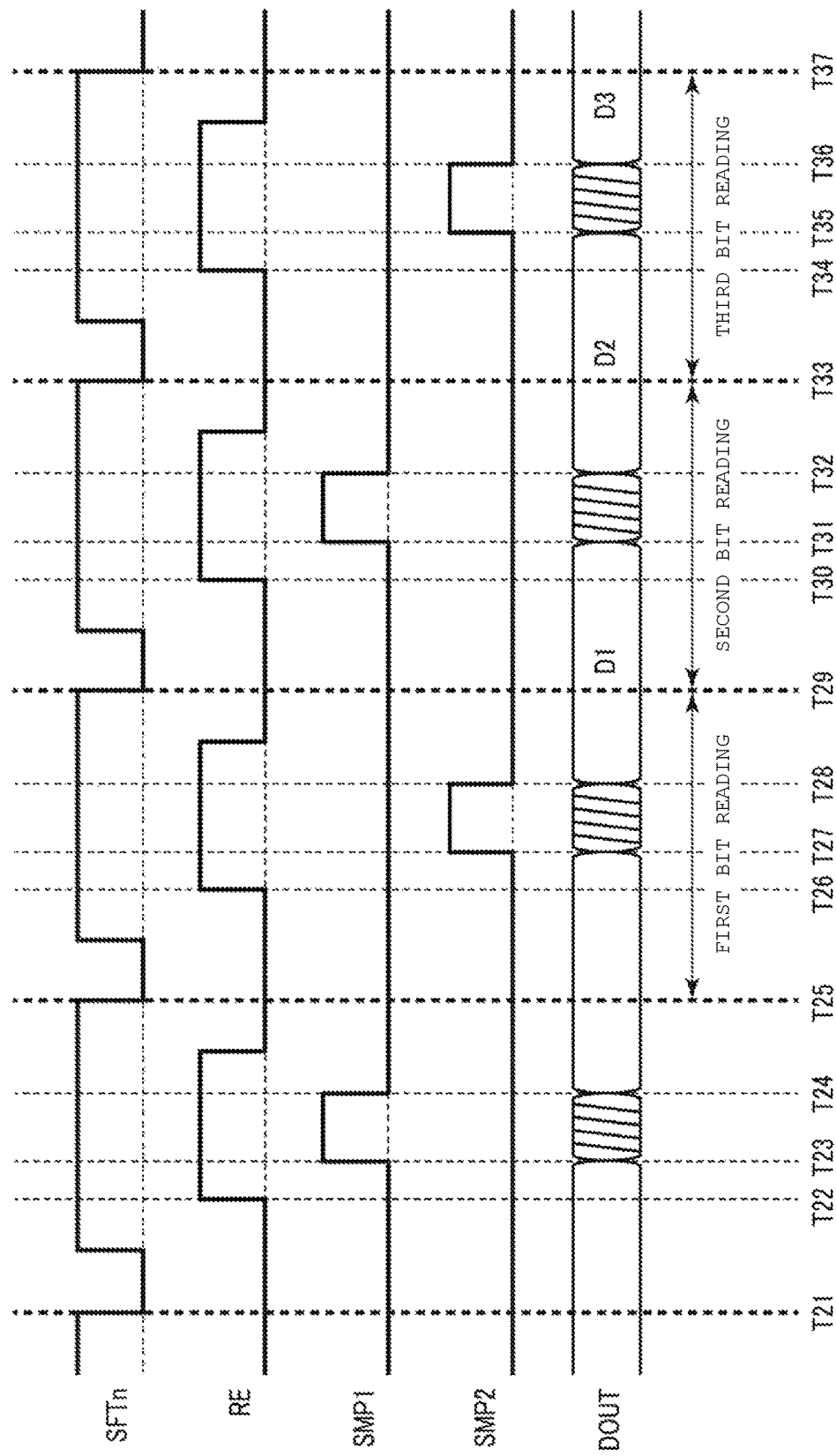
FIG. 18 is a timing chart of each signal of the read operation according to the second embodiment.

Next, details of the read operation performed by the circuits illustrated in FIGS. 13 to 15 will be described with reference to FIG. 18. FIG. 18 is a timing chart of each signal in the read operation. Description on the clamp signal VCLMP and the load signal VLOAD will be omitted.

First, the shift signal SFTn, the read enable signal RE, the signals SMP1 and SMP1n, and the signals SMP2 and SMP2n are all negated. That is, the shift signal SFTn goes to "H", and the read enable signal RE, the signals SMP1 and SMP1n, and the signals SMP2 and SMP2n go to "L".

Here, at time T21, the shift signal SFTn is asserted (for example, Thereby, a shift current flows through the magnetic storage thin line MML, and the magnetic domain of the magnetic storage thin line MML is shifted in a direction of the read position RP. At this time, it is assumed that the magnetic domain M1 is shifted to the read position RP. Accordingly, the resistance of the MTJ element 11 changes to a low resistance or a high resistance depending on the magnetization direction of the magnetic domain M1 shifted to the read position RP.

Next, after the shift signal SFTn is negated (for example, "H"), the read enable signal RE is asserted (for example, "H") at time T22. Thereby, the state signal VEVAL corresponding to the resistance of the magnetoresistance effect element 11 which changes depending on the magnetization direction of the magnetic domain M1 is obtained at a node SN.

Next, at time T23, the signal SMP1 is asserted (for example, "H"). Thereby, the pass transistor 44 is turned on and the voltage VSMP1 is equalized to the state signal VEVAL. Subsequently, at time T24, the signal SMP 1 is negated (for example, "L"). Thereby, the pass transistor 44 is turned on, and the voltage VSMP1 is sampled in the capacitor C11.

Next, the read enable signal RE is negated (for example, "L"). Furthermore, at time T25, the shift signal SFTn is asserted (for example, "L"). Thereby, a shift current flows through the magnetic storage thin line MML, and the magnetic domain of the magnetic storage thin line MML is shifted in the direction of the read position RP. At this time, the magnetic domain M2 is shifted to the read position RP. Thereby, the resistance of the magnetoresistance effect element 11 changes to a low resistance or a high resistance depending on the magnetization direction of the magnetic domain M2 shifted to the read position RP.

Next, after the shift signal SFTn is negated (for example, "H"), the read enable signal RE is asserted (for example, "H") at time T26. Thereby, the state signal VEVAL corresponding to the resistance of the magnetoresistance effect element 11 that changes depending on the magnetization direction of the magnetic domain M2 is obtained at the node SN.

Next, at time T27, the signal SMP2 is asserted (for example, "H"). Thereby, the pass transistor 45 is turned on, and the voltage VSMP2 is equalized to the state signal VEVAL. Subsequently, at time T28, the signal SMP2 is negated (for example, "L"). Thereby, the pass transistor 45 is turned off, and the voltage VSMP2 is sampled in the capacitor C12. Thereafter, the read enable signal RE is negated (for example, "L").

Next, the sense amplifier 47 compares the voltage VSMP1 with the voltage VSMP2, and outputs data D1 of the signal DOUT, based on the comparison result. In a case where the voltages VSMP1 and VSMP2 are substantially equal to each other, that is, in a case where a difference between the voltages VSMP1 and VSMP2 is equal to or less than a threshold value, the sense amplifier 47 outputs "L". Meanwhile, in a case where the voltages VSMP1 and VSMP2 are different from each other, that is, in a case where the difference between the voltages VSMP1 and VSMP2 is larger than the threshold value, the sense amplifier 47 outputs "H".

Thereafter, operations from time T29 to time T37 are performed in the same manner as the above-described operations from time T21 to time T29, the voltage VSMP1 is compared with the voltage VSMP2, and data D2 and D3 are respectively output in response to the signal DOUT, based on the comparison result.

Other configurations and operations are the same as in the first embodiment described above.

2-2. Effect of Second Embodiment

According to the second embodiment, it is possible to provide a magnetic storage device capable of performing a stable read operation in the same manner as in the first embodiment.

Furthermore, in the second embodiment, signals obtained by sensing resistance states according to two adjacent magnetic domains of the magnetic storage thin line MML are stored in the respective capacitors C11 and C12. Furthermore, in sensing the resistance states according to the magnetic domains subsequent to the two magnetic domains, signals are alternately stored in the capacitors C11 and C12. Thereby, the signals stored in the capacitors C11 and C12 are compared with each other, and thereby, data stored in consecutive magnetic domains can be determined. Thereby, it is possible to increase a data reading speed.

3. Other Modification Examples

Figure 19:
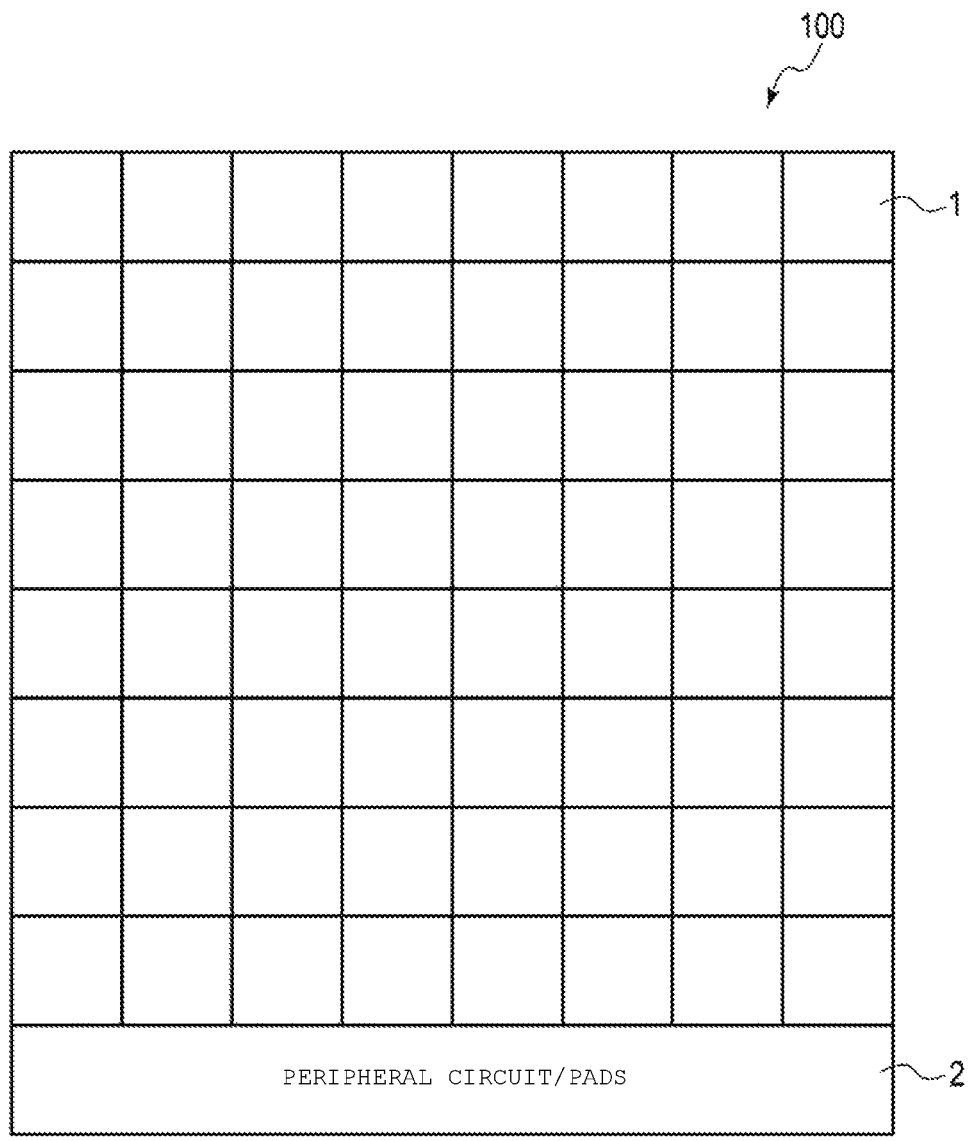
FIG. 19 is a diagram illustrating a memory chip in which the magnetic storage devices according to the first and second embodiments are arranged.
Figure 20:
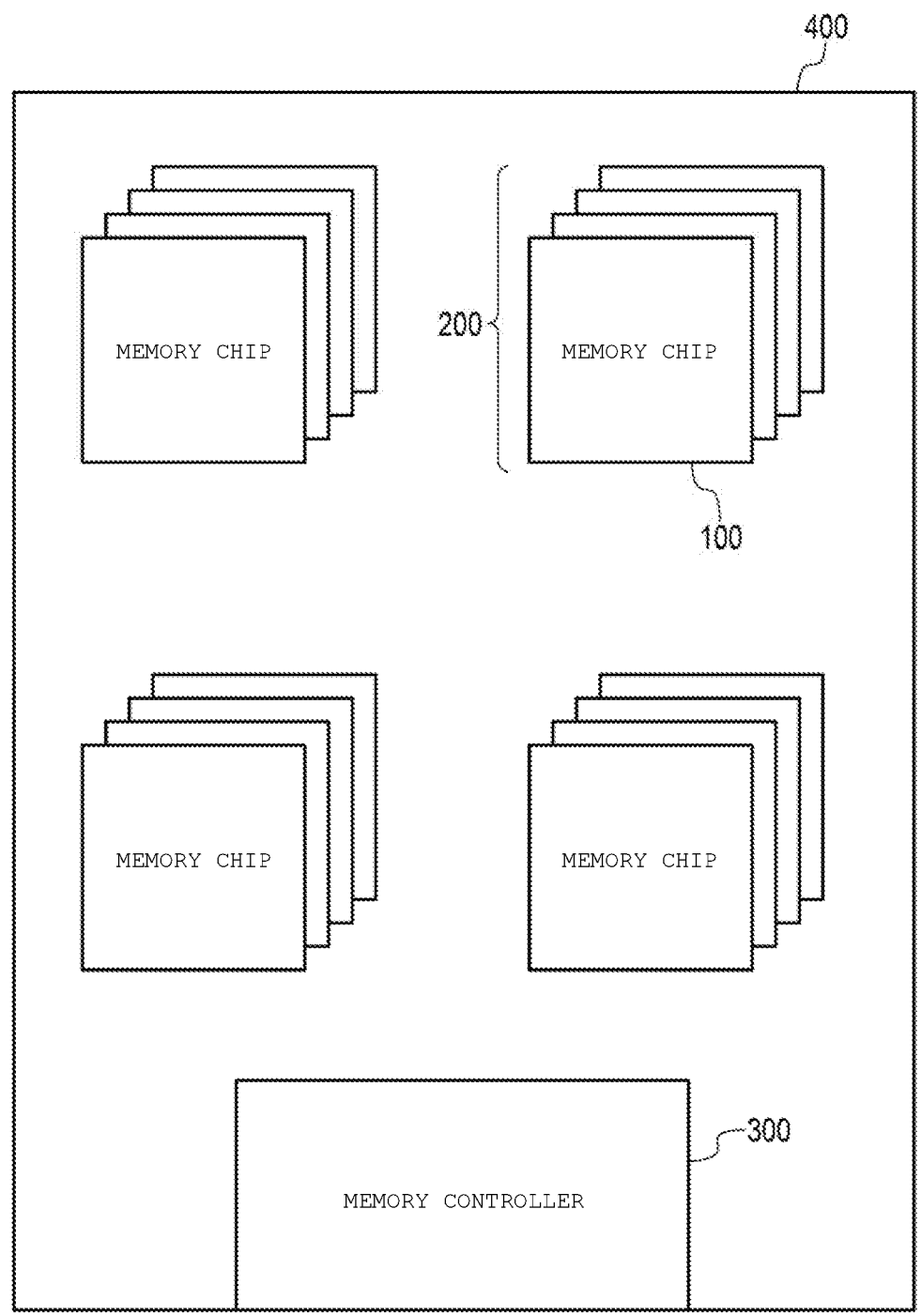
FIG. 20 is a diagram illustrating an SSD in which a memory chip is mounted.

FIG. 19 is a diagram illustrating a memory chip (semiconductor device) in which a plurality of magnetic storage devices 1 according to the first and second embodiments are arranged. FIG. 20 is a diagram illustrating an SSD on which memory chips are mounted.

As illustrated in FIG. 19, the plurality of the magnetic storage devices 1 according to the first and second embodiments are arranged in an array on a memory chip 100. A peripheral circuit and pads 2 are provided on the memory chip 100. The peripheral circuit includes a circuit that controls write and read operations of the magnetic storage device 1, and a power supply circuit that generates various power supplies to be supplied to the magnetic storage device 1. The pads include electrodes and the like used for connection with an external device.

In addition, as illustrated in FIG. 20, for example, a plurality of memory chips 100 are stacked to form a multi-chip 200. Furthermore, the multi-chip 200 is mounted on a solid state drive (SSD) 400 or the like together with a memory controller 300 that controls the multi-chip 200.

In the present specification, a term "electrically connected" includes a case where a plurality of conductors or elements are in physically contact with each other and a current flows between the plurality of conductors or elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic storage device comprising:
a magnetic wire including a linear magnetic body having first and second magnetic domains whose magnetization directions are variable;
a magnetoresistance element having a first resistance according to the magnetization direction of the first magnetic domain or a second resistance according to the magnetization direction of the second magnetic domain; and
a read circuit that compares the first resistance of the magnetoresistance element with the second resistance of the magnetoresistance element,
wherein the read circuit outputs first data when the first resistance and the second resistance correspond to the same low or high resistance state and outputs second data when the first resistance and the second resistance correspond to different low/high resistance states.

2. The magnetic storage device according to claim 1,
wherein the read circuit outputs the first data when a difference between the first resistance and the second resistance is equal to or less than a first value and outputs the second data when the difference between the first resistance and the second resistance is larger than the first value.

3. The magnetic storage device according to claim 1,
wherein the magnetoresistance element has a magnetic tunnel junction (MTJ) structure and includes a first magnetic layer, a second magnetic layer, and a nonmagnetic layer between the first magnetic layer and the second magnetic layer, and
wherein the second magnetic layer attains the same magnetization direction as the magnetization direction of the first magnetic domain by a magnetic induction from the first magnetic domain of the magnetic wire.

4. The magnetic storage device according to claim 3,
wherein the magnetoresistance element has a low resistance state when a magnetization direction of the second magnetic layer is parallel to the magnetization direction of the first magnetic layer, and
wherein the magnetoresistance element has a high resistance state when the magnetization direction of the second magnetic layer is antiparallel to the magnetization direction of the first magnetic layer.

5. The magnetic storage device according to claim 1,
wherein the magnetoresistance element includes a first magnetic layer and a nonmagnetic layer,
wherein the magnetoresistance element has a magnetic tunnel junction (MTJ) structure and includes the first magnetic domain of the magnetic wire, the first magnetic layer, and the nonmagnetic layer between the first magnetic domain and the first magnetic layer.

6. The magnetic storage device according to claim 5,
wherein the magnetoresistance element has a low resistance state when the magnetization direction of the first magnetic domain is parallel to a magnetization direction of the first magnetic layer, and
wherein the magnetoresistance element has a high resistance state when the magnetization direction of the first magnetic domain is antiparallel to the magnetization direction of the first magnetic layer.

7. The magnetic storage device according to claim 1,
wherein the read circuit includes a shift driver that shifts the first and second magnetic domains of the magnetic wire,
wherein the first magnetic domain of the magnetic wire is disposed at a first position in the magnetic wire, and
wherein, after the read circuit senses the first resistance depending on the magnetization direction of the first magnetic domain, the shift driver shifts the second magnetic domain to the first position.

8. The magnetic storage device according to claim 7,
wherein the first position is a position sufficiently close to a second magnetic layer to cause the second magnetic layer to attain the same magnetization direction as the magnetization direction of the first or second magnetic domain that is at the first position by a magnetic induction.

9. The magnetic storage device according to claim 1,
wherein the read circuit includes a first circuit that senses the first resistance and the second resistance of the magnetoresistance element, and a sense amplifier that compares the first resistance and the second resistance, which are sensed by the first circuit, with each other, and
wherein the first circuit includes a second circuit that supplies or stops a read current to the magnetoresistance element, a capacitor that stores a signal corresponding to either the first resistance or the second resistance, and a third circuit that sets timing for storing the signal in the capacitor.

10. The magnetic storage device according to claim 1,
wherein the read circuit includes a first circuit that senses the first resistance and the second resistance of the magnetoresistance element, and a sense amplifier that compares the first resistance and the second resistance which are sensed by the first circuit, with each other, and
wherein the first circuit includes a second circuit that supplies or stops a read current to the magnetoresistance element, a first capacitor that stores a signal corresponding to the first resistance, a second capacitor that stores a signal corresponding to the second resistance, a third circuit that sets timing for storing the signal corresponding to the first resistance in the first capacitor, and a fourth circuit that sets timing for storing the signal corresponding to the second resistance in the second capacitor.

11. The magnetic storage device according to claim 1,
wherein the read circuit outputs the first data when a difference between the first resistance and the second resistance is equal to or less than a first value and outputs the second data when the difference between the first resistance and the second resistance is larger than the first value, and
wherein the read circuit includes a first circuit that senses the first resistance and the second resistance of the magnetoresistance element, and a sense amplifier that compares the first resistance and the second resistance which are sensed by the first circuit, with each other.

12. The magnetic storage device according to claim 1, wherein the first and second magnetic domains are adjacent magnetic domains in the liner magnetic body.

13. A magnetic storage device comprising:
a magnetic wire including a linear magnetic body having first and second magnetic domains whose magnetization directions are variable;
a magnetoresistance element having a first resistance when the first magnetic domain is at a position where the magnetoresistance element is subject to influence from magnetic induction by the first magnetic domain and a second resistance when the second magnetic domain is at a position where the magnetoresistance element is subject to influence from magnetic induction by the second magnetic domain; and
a read circuit configured generate a first result if the first and second magnetic domains have the same magnetization directions and a second result if the first and second magnetic domains have the different magnetization directions.

14. The magnetic storage device according to claim 13, wherein the first and second magnetic domains are adjacent magnetic domains in the liner magnetic body.

15. The magnetic storage device according to claim 14, wherein the magnetoresistance element has a magnetic tunnel junction (MTJ) structure and includes a first magnetic layer, a second magnetic layer, and a nonmagnetic layer between the first magnetic layer and the second magnetic layer, and
wherein the second magnetic layer attains the same magnetization direction as the magnetization direction of the first or second magnetic domain that is at the position where the magnetoresistance element is subject to influence from magnetic induction by the first or second magnetic domain.

16. The magnetic storage device according to claim 14, wherein the magnetoresistance element includes a first magnetic layer and a nonmagnetic layer,
wherein the magnetoresistance element has a magnetic tunnel junction (MTJ) structure and includes the first or second magnetic domain that is at the position where the magnetoresistance element is subject to influence from magnetic induction by the first or second magnetic domain, the first magnetic layer, and the nonmagnetic layer between the first magnetic domain and the first magnetic layer.

17. The magnetic storage device according to claim 13, wherein the read circuit includes a shift driver that shifts the second magnetic domain into the position where the magnetoresistance element is subject to influence from magnetic induction by the second magnetic domain.

18. The magnetic storage device according to claim 13, wherein the read circuit includes a first circuit that senses the first resistance and the second resistance of the magnetoresistance element, and a sense amplifier that compares the first resistance and the second resistance, which are sensed by the first circuit, with each other, and
wherein the first circuit includes a second circuit that supplies or stops a read current to the magnetoresistance element, a capacitor that stores a signal corresponding to either the first resistance or the second resistance, and a third circuit that sets timing for storing the signal in the capacitor.

19. The magnetic storage device according to claim 13, wherein the read circuit includes a first circuit that senses the first resistance and the second resistance of the magnetoresistance element, and a sense amplifier that compares the first resistance and the second resistance which are sensed by the first circuit, with each other, and
wherein the first circuit includes a second circuit that supplies or stops a read current to the magnetoresistance element, a first capacitor that stores a signal corresponding to the first resistance, a second capacitor that stores a signal corresponding to the second resistance, a third circuit that sets timing for storing the signal corresponding to the first resistance in the first capacitor, and a fourth circuit that sets timing for storing the signal corresponding to the second resistance in the second capacitor.

20. The magnetic storage device according to claim 13, wherein the read circuit outputs the first result when a difference between the first resistance and the second resistance is equal to or less than a first value and outputs the second result when the difference between the first resistance and the second resistance is larger than the first value, and
wherein the read circuit includes a first circuit that senses the first resistance and the second resistance of the magnetoresistance element, and a sense amplifier that compares the first resistance and the second resistance which are sensed by the first circuit, with each other.

* * * * *